United States Patent
Lee et al.

(10) Patent No.: US 9,536,950 B2
(45) Date of Patent: Jan. 3, 2017

(54) SEMICONDUCTOR DEVICE AND METHOD OF FABRICATING THE SAME

(71) Applicant: Samsung Electronics Co., Ltd., Suwon-si (KR)

(72) Inventors: Jae-Hwan Lee, Seoul (KR); Sangsu Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/606,017

(22) Filed: Jan. 27, 2015

(65) Prior Publication Data

US 2015/0311286 A1    Oct. 29, 2015

(30) Foreign Application Priority Data

Apr. 25, 2014    (KR) .................. 10-2014-0050169

(51) Int. Cl.
*H01L 27/12*    (2006.01)
*H01L 29/10*    (2006.01)
(Continued)

(52) U.S. Cl.
CPC ... *H01L 29/1033* (2013.01); *H01L 21/823807* (2013.01); *H01L 21/823821* (2013.01); *H01L 27/0924* (2013.01); *H01L 29/165* (2013.01); *H01L 29/42356* (2013.01); *H01L 29/49* (2013.01); *H01L 29/66545* (2013.01); *H01L 29/66795* (2013.01); *H01L 29/785* (2013.01); *H01L 21/823842* (2013.01); *H01L 21/84* (2013.01); *H01L 27/1203* (2013.01); *H01L 29/0665* (2013.01); *H01L 29/7841* (2013.01)

(58) Field of Classification Search
CPC .......... H01L 29/1033; H01L 29/42356; H01L 29/49; H01L 29/66795; H01L 29/785; H01L 29/165; H01L 21/823821; H01L 27/0924; H01L 29/66545; H01L 21/823807; H01L 21/823842
USPC ............... 257/351, 347, 18, 19, 20, 22, 190, 192,257/E21.409, E21.421; 438/157, 283, 284, 199

See application file for complete search history.

(56) References Cited

U.S. PATENT DOCUMENTS 7,244,958 B2 * 7/2007 Shang ............. H01L 21/823807 257/18
7,384,829 B2    6/2008 Cheng et al.
(Continued)

FOREIGN PATENT DOCUMENTS

JP    2007-142291 A    6/2007
KR    10-2009-0044566 A    5/2009

OTHER PUBLICATIONS

Orlowski et al, 'Si, SiGe, Ge, and III-V Semiconductor Nanomembranes and NanowiresEnabled by SiGe Epitaxy', ECS Transactions, 33, (6), (2010), pp. 777-789.

*Primary Examiner* — Thinh T Nguyen
(74) *Attorney, Agent, or Firm* — Muir Patent Law, PLLC

(57) ABSTRACT

A semiconductor device may include a strain relaxed buffer layer provided on a substrate to contain silicon germanium, a semiconductor pattern provided on the strain relaxed buffer layer to include a source region, a drain region, and a channel region connecting the source region with the drain region, and a gate electrode enclosing the channel region and extending between the substrate and the channel region. The source and drain regions may contain germanium at a concentration of 30 at % or higher.

8 Claims, 47 Drawing Sheets

(51) Int. Cl.
*H01L 29/423* (2006.01)
*H01L 29/49* (2006.01)
*H01L 29/66* (2006.01)
*H01L 29/78* (2006.01)
*H01L 21/8238* (2006.01)
*H01L 27/092* (2006.01)
*H01L 29/165* (2006.01)
H01L 29/06 (2006.01)
H01L 21/84 (2006.01)

(56) References Cited

U.S. PATENT DOCUMENTS

| | | |
|---|---|---|
| 7,538,390 B2 | 5/2009 | Wang et al. |
| 7,737,502 B2 | 6/2010 | Beintner et al. |
| 8,154,082 B2 | 4/2012 | Moriyama et al. |
| 8,314,464 B2 * | 11/2012 | Iwayama ............... B82Y 10/00 257/23 |
| 8,349,667 B2 | 1/2013 | Saracco et al. |
| 2005/0285097 A1 * | 12/2005 | Shang ............. H01L 21/823807 257/19 |
| 2006/0216897 A1 * | 9/2006 | Lee ........................ B82Y 10/00 438/282 |
| 2008/0001171 A1 * | 1/2008 | Tezuka ............ H01L 21/823807 257/191 |
| 2008/0135949 A1 | 6/2008 | Lo et al. |
| 2009/0072271 A1 | 3/2009 | Gomez et al. |
| 2009/0130826 A1 * | 5/2009 | Kim ................. H01L 21/02381 438/478 |
| 2010/0022073 A1 | 1/2010 | Fitzgerald et al. |
| 2010/0327317 A1 | 12/2010 | Pillarisetty et al. |
| 2011/0012090 A1 | 1/2011 | Singh et al. |
| 2011/0062421 A1 * | 3/2011 | Iwayama ............... B82Y 10/00 257/29 |

* cited by examiner

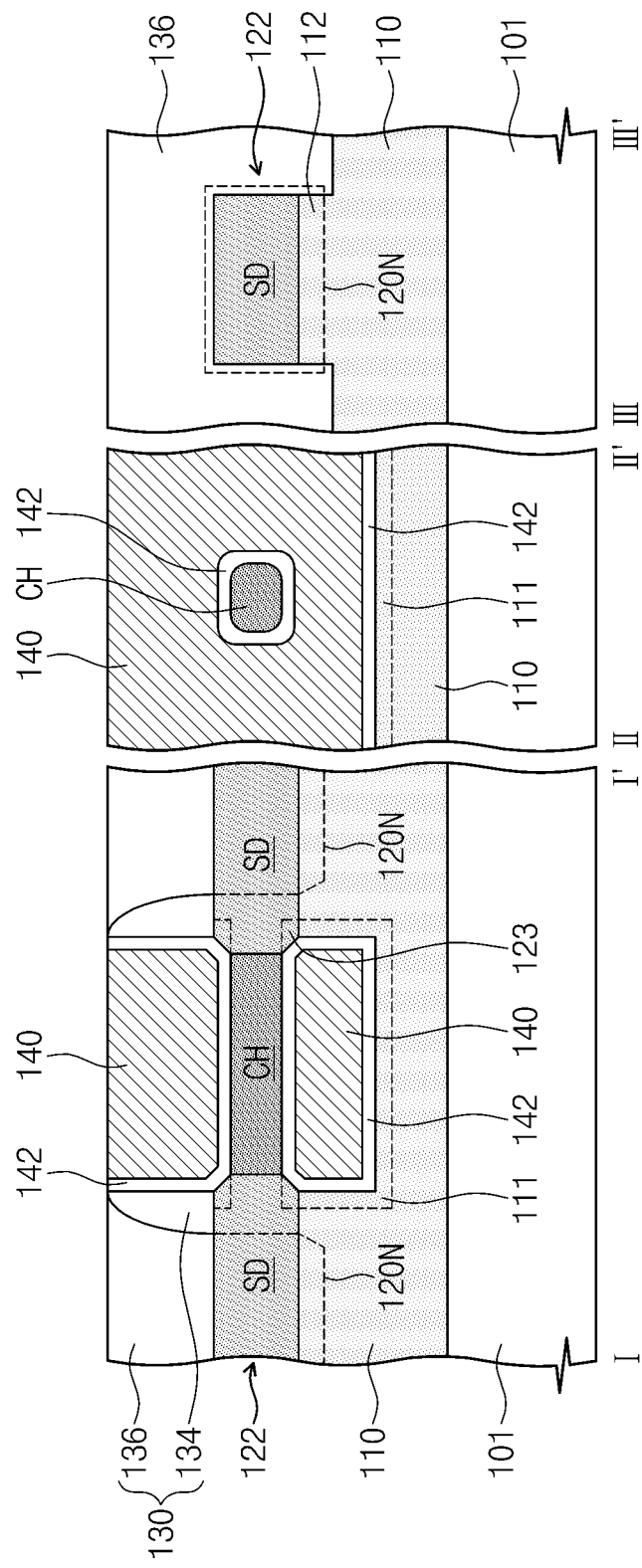

1200

SEMICONDUCTOR DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0050169, filed on Apr. 25, 2014, in the Korean Intellectual Property Office, the entire contents of which are hereby incorporated by reference.

TECHNICAL FIELD

Example embodiments of the inventive concept relate to a semiconductor device and a method of fabricating the same, and in particular, to a semiconductor device with a field effect transistor and a method of fabricating the same.

DESCRIPTION OF RELATED ART

Semiconductor devices are increasingly being used in consumer, commercial, and other electronic devices. Semiconductor devices may be classified into a memory device for storing data, a logic device for processing data, and a hybrid device including both of memory and logic elements. Due to the increased demand for electronic devices with fast speed and/or low power consumption, semiconductor devices are used to provide high reliability, high performance, and/or multiple functions. To satisfy these technical requirements, complexity and/or integration density of semiconductor devices are being increased.

SUMMARY

Example embodiments of the inventive concept provide a semiconductor device, in which a nano wire with high germanium concentration is provided.

Other example embodiments of the inventive concept provide a method of fabricating a semiconductor device, in which a nano wire with high germanium concentration is provided.

According to example embodiments of the inventive concept, a semiconductor device may include a strain relaxed buffer layer provided on a substrate, the strain relaxed buffer layer containing silicon germanium; a semiconductor pattern provided on the strain relaxed buffer layer, the semiconductor pattern including a source region, a drain region, and a channel region connecting the source region with the drain region; and a gate electrode enclosing the channel region and extending between the substrate and the channel region. The source and drain regions contain germanium at a concentration of 30 atomic percent (at %) or more.

In example embodiments, the strain relaxed buffer layer contains germanium at a concentration of 30 at % or less.

In example embodiments, the channel region contains germanium at a concentration of 60 at % or more.

In example embodiments, the strain relaxed buffer layer may have a recessed region adjacent to the channel region, and the gate electrode extends into the recessed region.

In example embodiments, a germanium concentration of the strain relaxed buffer layer may be higher at a portion adjacent to the recessed region than at another portion adjacent to the source and drain regions.

In example embodiments, the strain relaxed buffer layer may include a plurality of buffer layers stacked on the substrate, and the semiconductor pattern may include a plurality of semiconductor layers stacked on the substrate. The buffer layers and the semiconductor layers may be alternatingly stacked one on top of another.

According to example embodiments of the inventive concept, a semiconductor device may include a substrate including a first region and a second region; a strain relaxed buffer layer provided on the substrate, the strain relaxed buffer layer containing silicon germanium; a first transistor provided on the strain relaxed buffer layer of the first region, the first transistor including a first channel region protruding from the substrate and a first gate electrode covering a side surface of the first channel region; and a second transistor provided on the strain relaxed buffer layer of the second region, the second transistor including a second channel region and a second gate electrode enclosing the second channel region and extending between the substrate and the second channel region. The first and second channel regions contain silicon, and a germanium concentration of the second channel region may be higher than that of the first channel region.

In example embodiments, the first channel region may include a silicon layer, and the second channel region may be a silicon germanium layer.

In example embodiments, the second transistor may further include source/drain regions at both sides of the second channel region. The source/drain regions may include a silicon germanium layer and may have a germanium concentration that is higher than that of the strain relaxed buffer layer.

In example embodiments, the source/drain regions may contain germanium at a concentration of 30 at % or more.

In example embodiments, the first and second gate electrodes may include an aluminum-containing metal layer.

In example embodiments, an aluminum concentration of the first gate electrode may be higher than that of the second gate electrode.

In example embodiments, the first and second gate electrodes further include a tungsten layer provided on the metal layer.

In example embodiments, the first transistor may be an NMOS transistor and the second transistor may be a PMOS transistor.

According to example embodiments of the inventive concept, a method of fabricating a semiconductor device may include forming a strain relaxed buffer layer containing silicon germanium, on a substrate; forming a semiconductor pattern on the strain relaxed buffer layer, the semiconductor pattern including a channel region and source/drain regions at both sides of the channel region; recessing an upper portion of the strain relaxed buffer layer using an insulating pattern covering the source/drain regions; selectively removing a portion of the strain relaxed buffer layer positioned below the channel region to form a gap region; and forming a gate electrode to enclose the channel region of the semiconductor pattern. The semiconductor pattern may be formed to contain germanium at a concentration of 30 at % or more.

In example embodiments, the strain relaxed buffer layer may be formed to contain germanium at a concentration of 30 at % or less.

In example embodiments, the method may further include performing a surface treatment process to round a surface of the channel region, after the forming of the gap region.

In example embodiments, the surface treatment process may include a thermal treatment process in an oxidizing atmosphere.

In example embodiments, the surface treatment process may be performed to result in the channel region having a higher germanium concentration than that of the source/drain regions.

In example embodiments, the channel region may be formed to contain germanium at a concentration of 60 at % or more.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 7A are plan views illustrating a method of fabricating a semiconductor device according to example embodiments of the inventive concept.

FIGS. 1B through 7B are sectional views taken along lines I-I', II-II', and III-III' of FIGS. 1A through 7A, respectively.

FIGS. 8A through 12A are plan views illustrating a method of fabricating a semiconductor device according to other example embodiments of the inventive concept.

FIGS. 8B through 12B are sectional views taken along lines I-I', II-II', and III-III' of FIGS. 8A through 12A, respectively.

FIGS. 13A through 19A are plan views illustrating a method of fabricating a semiconductor device according to still other example embodiments of the inventive concept.

FIGS. 13B through 19B are sectional views taken along lines I-I', II-II', and III-III' of FIGS. 13A through 19A, respectively.

FIGS. 13C through 19C are sectional views taken along lines IV-IV', V-V', and VI-VI' of FIGS. 13A through 19A, respectively.

Figure 1A:
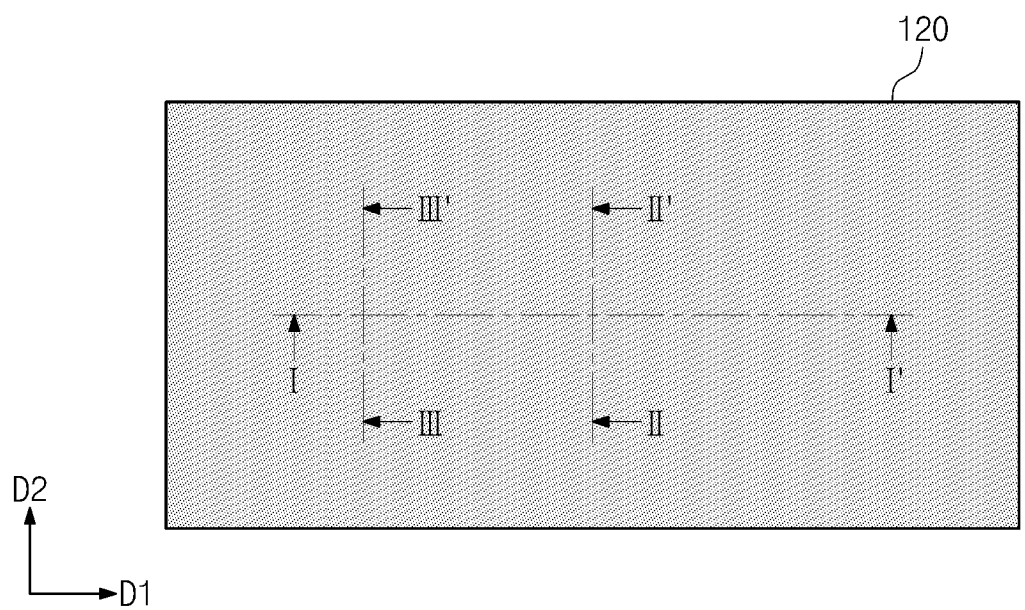

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description may be omitted.

As used herein the term "and/or" includes any and all combinations of one or more of the associated listed items.

It will be understood that when an element is referred to as being "connected" or "coupled" to another element, it can be directly connected or coupled to the other element or intervening elements may be present. Other words used to describe the relationship between elements or layers should be interpreted in a like fashion (e.g., "between" versus "directly between," "adjacent" versus "directly adjacent," "on" versus "directly on"). However, the term "contact," as used herein refers to direct contact (i.e., touching) unless the context indicates otherwise.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. The term "about" when used in connection with a numerical value may also be used to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 7A are plan views illustrating a method of fabricating a semiconductor device 100A according to example embodiments of the inventive concept, and FIGS. 1B through 7B are sectional views taken along lines I-I', II-II', and III-III' of FIGS. 1A through 7A, respectively.

Figure 1B:
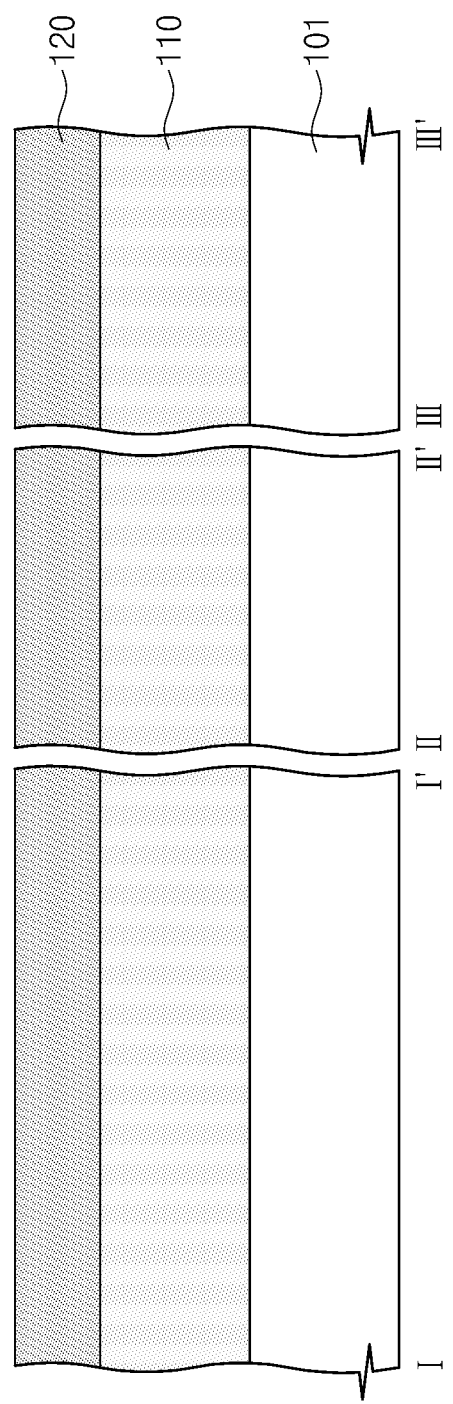

Referring to FIGS. 1A and 1B, a strain relaxed buffer (SRB) layer 110 and a semiconductor layer 120 may be sequentially formed on a substrate 101. The substrate 101 may be a silicon-containing semiconductor wafer or a silicon-on-insulator (SOI) wafer. The substrate 101 may have a first conductivity type. The SRB layer 110 and the semiconductor layer 120 may also have the first conductivity type.

The SRB layer 110 may be formed by an epitaxial growth process using the substrate 101 as a seed layer. As an example, the epitaxial growth process may be a chemical vapor deposition (CVD) process or a molecular beam epitaxy (MBE) process. The SRB layer 110 and the semiconductor layer 120 may be successively formed in the same chamber. The SRB layer 110 and the semiconductor layer 120 may be grown from the entire top surface of the substrate 101.

The SRB layer 110 and the semiconductor layer 120 may be, for example, a silicon germanium layer. The SRB layer 110 may facilitate a process of growing the semiconductor layer 120 from the substrate 101, which may be formed of silicon. The SRB layer 110 may contain germanium at a lower concentration than the semiconductor layer 120. For example, in one embodiment, the SRB layer 110 may contain germanium at a concentration of 30 atomic percent (at %) or less. The semiconductor layer 120 may contain germanium at a concentration of 30 at % or more. In general, in the case where a germanium concentration of a silicon germanium layer is 30 at % or more, it is difficult to directly grow such a silicon germanium layer from a silicon layer. According to example embodiments of the inventive concept, the SRB layer 110 having a germanium concentration of 30 at % or less may be directly grown from the substrate 101 that is made of silicon, and then, the semiconductor layer 120 of high germanium concentration may be grown from the SRB layer 110 serving as a seed layer through an epitaxial growth process. Accordingly, it is possible to grow the semiconductor layer 120 of high quality and high germanium concentration.

Due to the difference in germanium concentration between the SRB layer 110 and the semiconductor layer 120, the SRB layer 110 may have an etch selectivity with respect to the semiconductor layer 120. For example, when the SRB layer 110 is etched using a specific etch recipe, the SRB layer 110 may be etched at a higher etch rate than the semiconductor layer 120 (for example, with preventing the semiconductor layer 120 from being etched). In certain cases, the etch selectivity may be expressed as a ratio of an etch rate of the SRB layer 110 to an etch rate of the semiconductor layer 120.

Figure 2A:
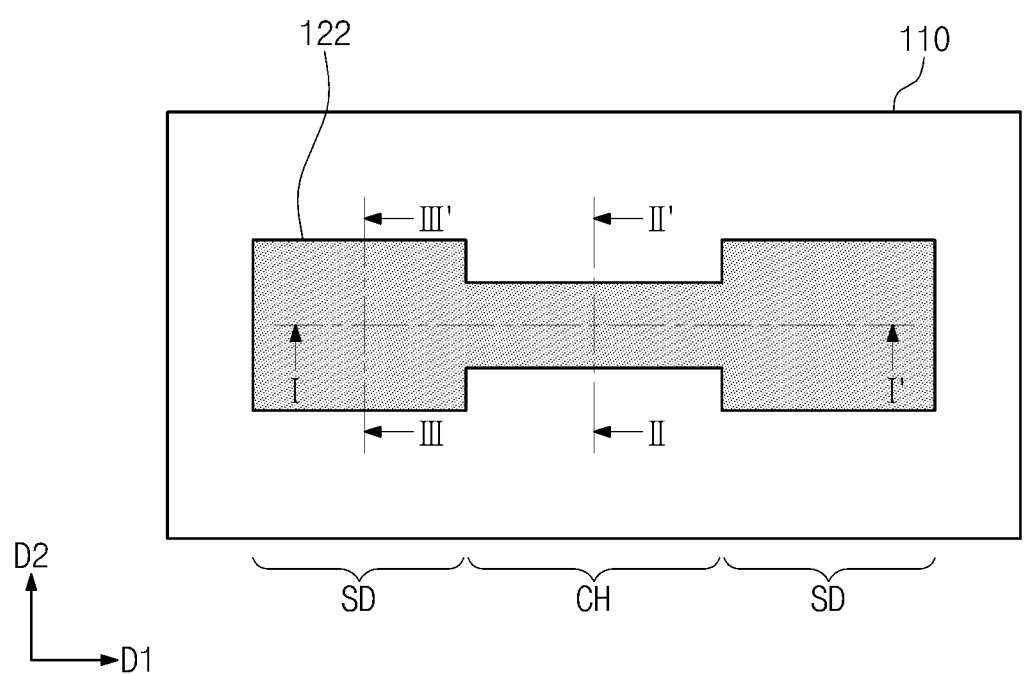
Figure 2B:
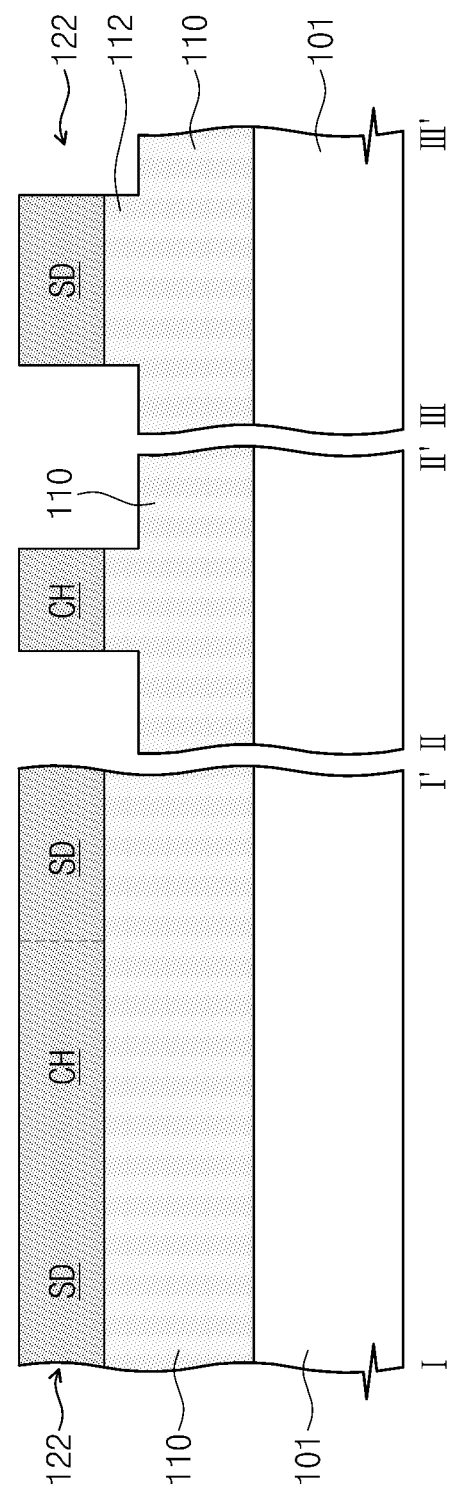

Referring to FIGS. 2A and 2B, a first mask pattern may be formed on the semiconductor layer 120. The first mask pattern may extend along a first direction D1. A shape of the first mask pattern may be variously changed from the example shown in FIG. 2A. The first mask pattern may include, for example, at least one of a photoresist layer, a silicon nitride layer, a silicon oxide layer, and a silicon oxynitride layer.

The semiconductor layer 120 may be patterned to form an upper semiconductor pattern 122 with source/drain regions SD and a channel region CH. The upper semiconductor pattern 122 may be formed by a patterning process using the first mask pattern as an etch mask. The upper semiconductor pattern 122 may extend in the first direction D1. The source/drain regions SD and the channel region CH may be formed under both end portions and a center portion, respectively, of the first mask pattern. The source/drain regions SD may include source and drain regions spaced apart from each other in the first direction D1. The channel region CH may connect the source region to the drain region. During the patterning process, an upper portion of the SRB layer 110 may be patterned to form a lower semiconductor pattern 112.

The patterning process may include a dry and/or wet etching process. As an example, the patterning process may be anisotropically performed using a dry etching technology. After the patterning process, the first mask pattern may be removed. As an example, the removal process of the first mask pattern may include an ashing process or a wet etching process.

Referring to FIGS. 3A, 3B, 4A, and 4B, an insulating pattern 130 may be formed on the upper semiconductor pattern 122. The insulating pattern 130 may include an insulating spacer 134 and an interlayered insulating layer 136. The insulating pattern 130 may be formed to define a gate region 135 exposing the channel region CH and extending in a second direction D2 or across the first direction D1.

Figure 3A:
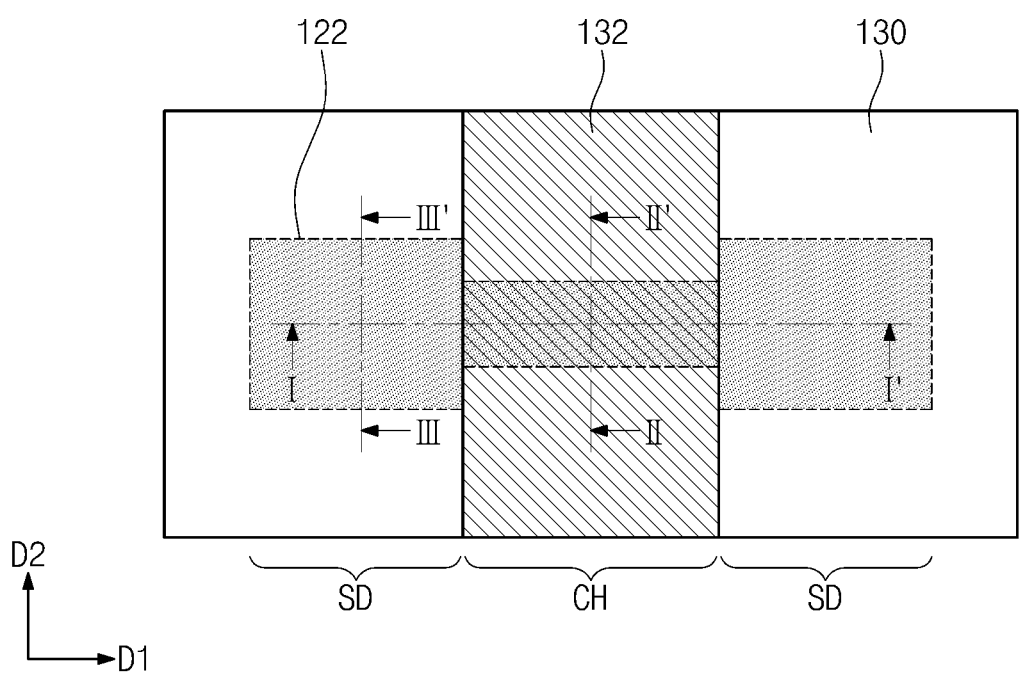
Figure 3B:
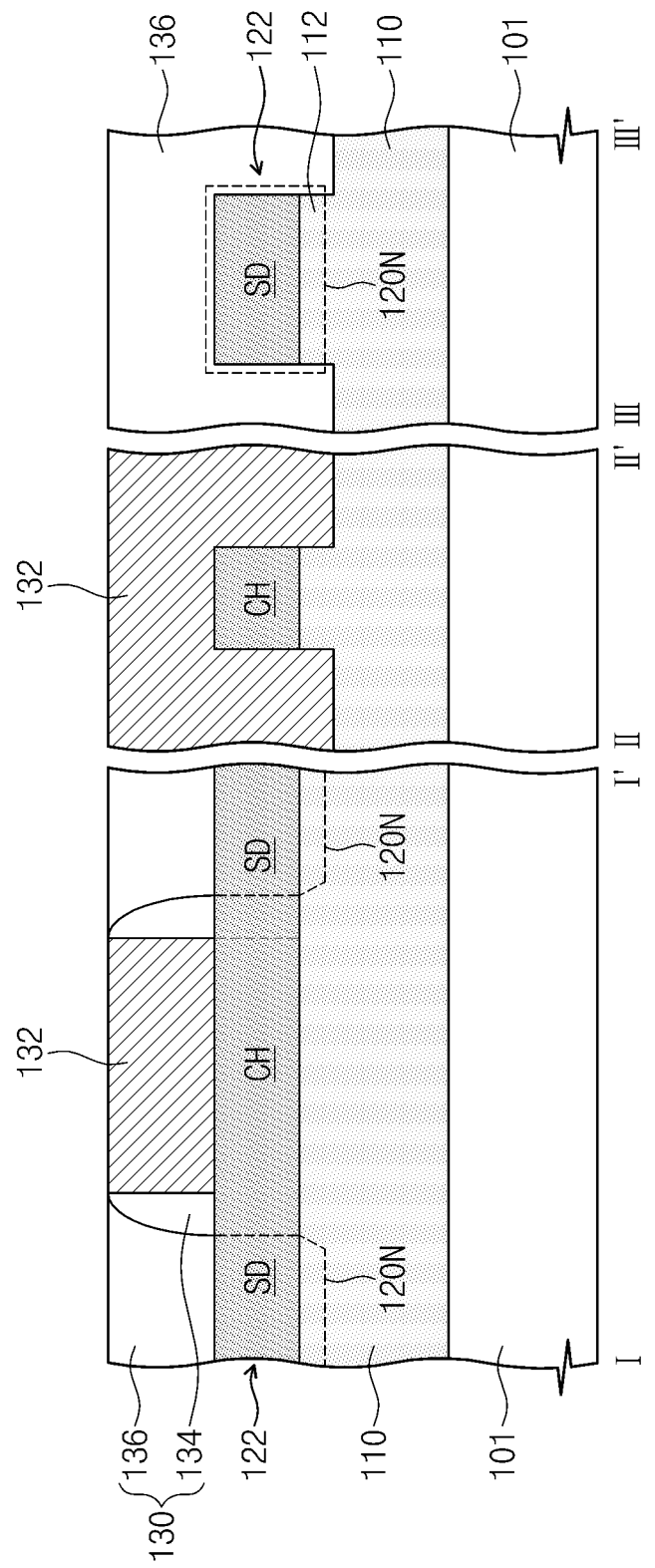
Figure 4A:
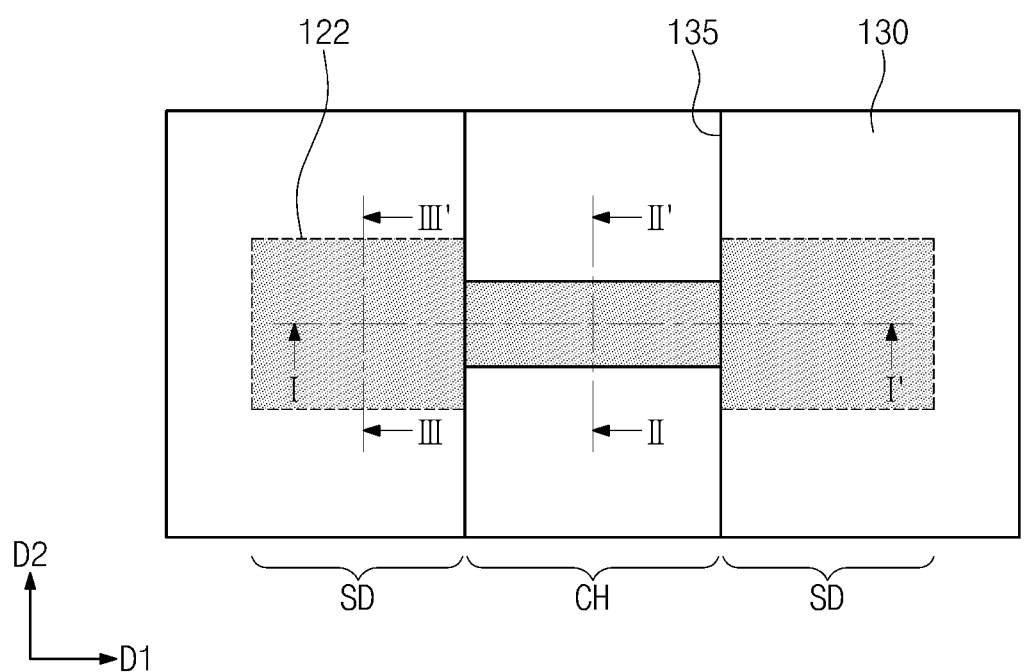
Figure 4B:
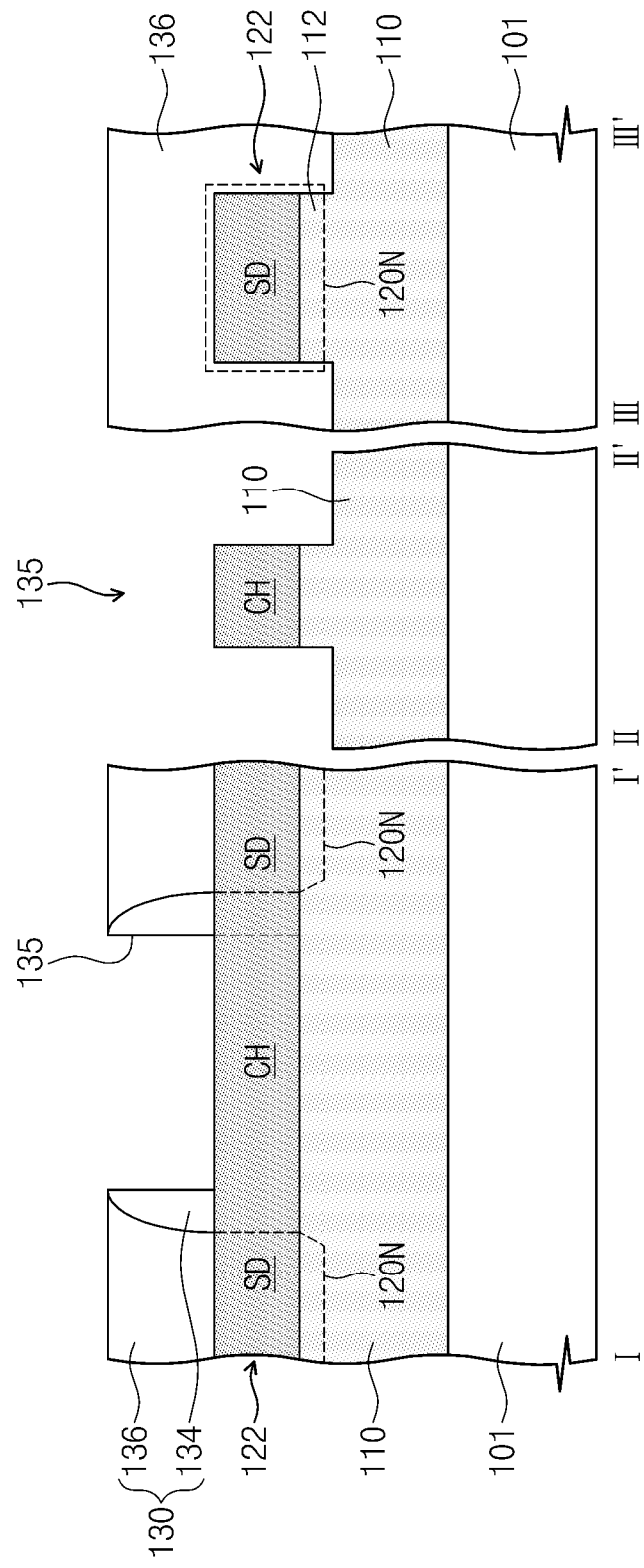

For example, as shown in FIGS. 3A and 3B, a dummy gate 132 may be formed to cover the channel region CH of the upper semiconductor pattern 122. The dummy gate 132 may extend in the second direction D2. The dummy gate 132 may be formed to expose the source/drain regions SD of the upper semiconductor pattern 122. In certain embodiments, the dummy gate 132 may be formed of or include a polysilicon layer, a silicon nitride layer, or a silicon oxynitride layer. Thereafter, the insulating spacer 134 may be formed on sidewalls of the dummy gate 132. The insulating spacer 134 may include a material having an etch selectivity with respect to the dummy gate 132. As an example, the insulating spacer 134 may include at least one of a silicon oxide layer, a silicon nitride layer, or a silicon oxynitride layer.

The interlayered insulating layer 136 may be formed on the substrate 101. The formation of the interlayered insulating layer 136 may include, for example, forming an insulating layer on the substrate 101 using a chemical vapor deposition (CVD) process and performing a planarization process on the insulating layer to expose a top surface of the dummy gate 132. The interlayered insulating layer 136 may be formed of or include a silicon oxide layer.

Impurities may be injected into the source/drain regions SD using the dummy gate 132 and the insulating spacer 134 as a mask, and thus, impurity regions 120N of a second conductivity type may be formed in the source/drain regions SD. Here, the second conductivity type may be different from the first conductivity type. In certain embodiments, the impurity regions 120N may extend from the source/drain regions SD of the upper semiconductor pattern 122 into an upper portion of the lower semiconductor pattern 112.

Referring back to FIGS. 4A and 4B, the dummy gate 132 may be selectively removed to form the gate region 135. Accordingly, the insulating pattern 130 including the insulating spacer 134 and the interlayered insulating layer 136 may cover the source/drain regions SD of the upper semiconductor pattern 122 and expose the channel region CH of the upper semiconductor pattern 122. As such, the channel region CH may be exposed through the gate region 135.

Figure 5A:
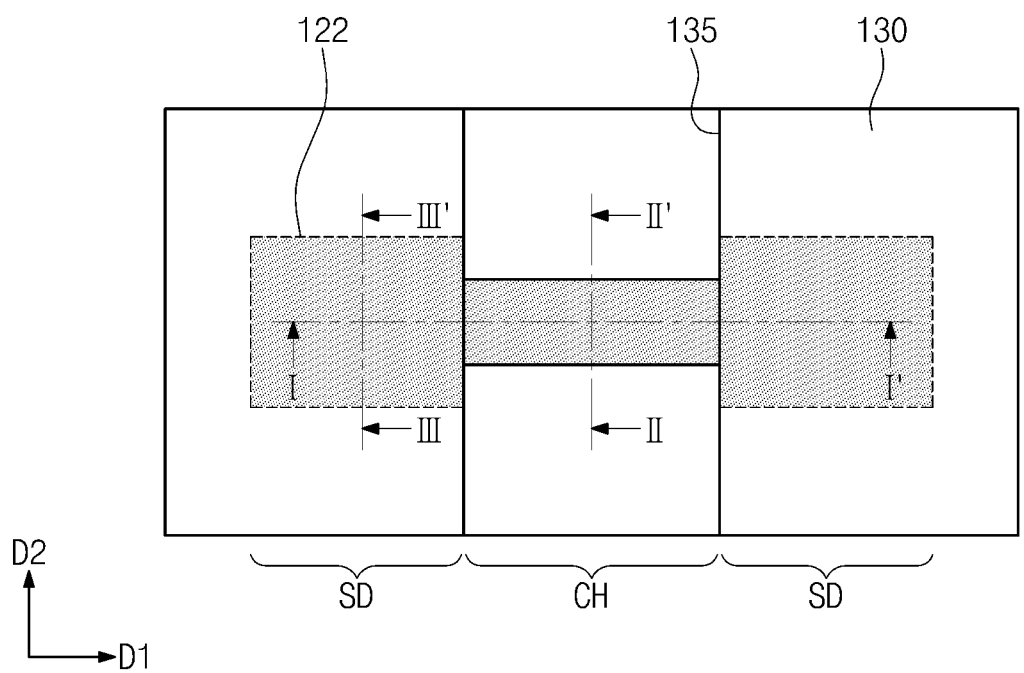
Figure 5B:
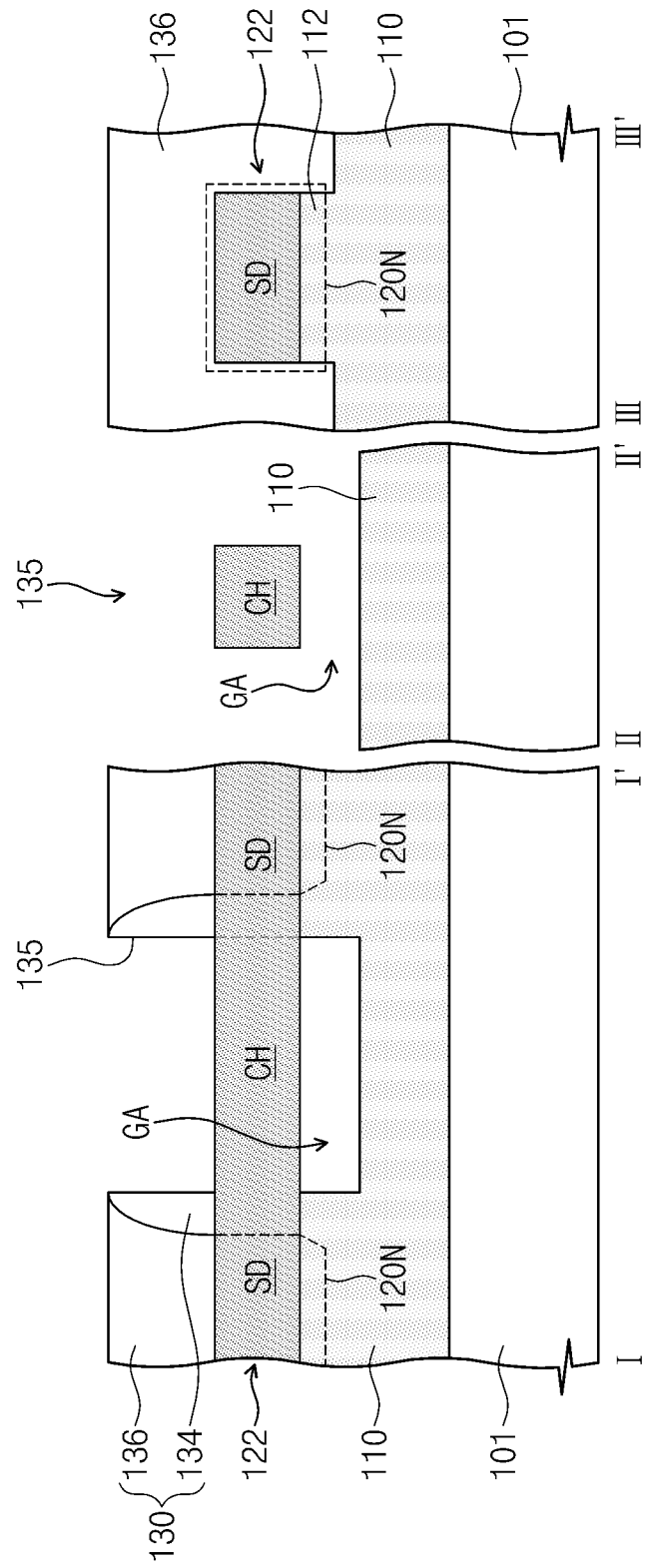

Referring to FIGS. 5A and 5B, the lower semiconductor pattern 112 and the SRB layer 110 exposed by the gate region 135 may be partially removed. The removal process may be performed using a selective etching process capable of selectively removing the SRB layer 110 and preventing the upper semiconductor pattern 122 from being etched. As an example, the selective etching process may be performed using an etching solution containing nitric acid or hydrogen peroxide. In certain embodiments, the etching solution may further contain hydrofluoric acid (HF). The SRB layer 110 and the lower semiconductor pattern 112 may contain a higher amount of silicon than the upper semiconductor pattern 122 and thus can be selectively etched by the etching solution. Accordingly, the SRB layer 110 and the lower semiconductor pattern 112 exposed by the gate region 135 may be partially removed to form a gap region GA under the channel region CH of the upper semiconductor pattern 122.

Figure 6A:
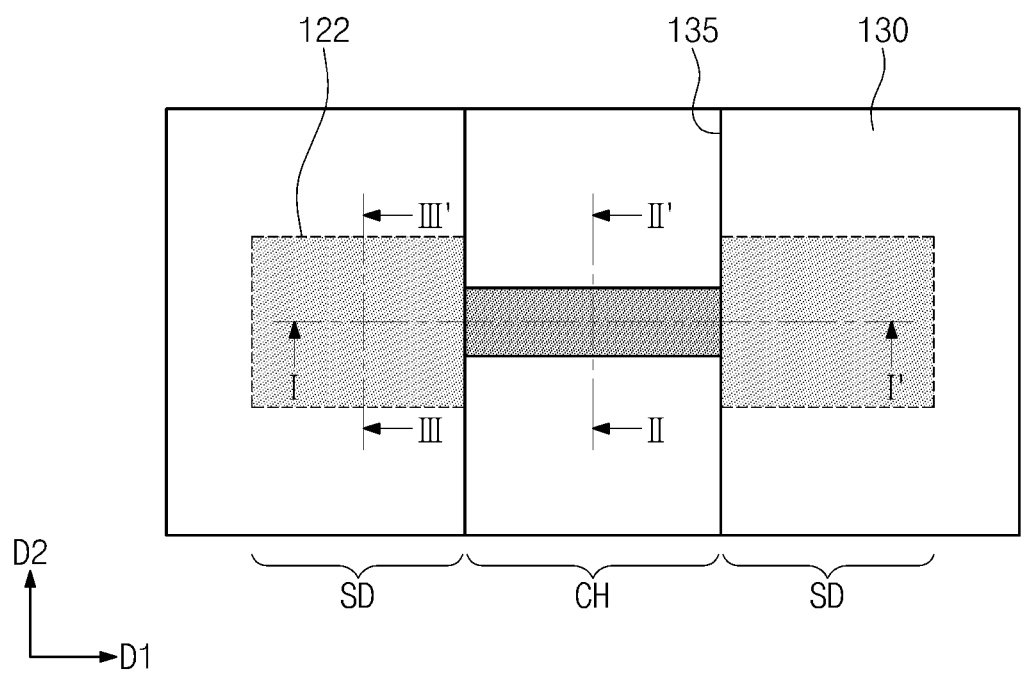
Figure 6B:
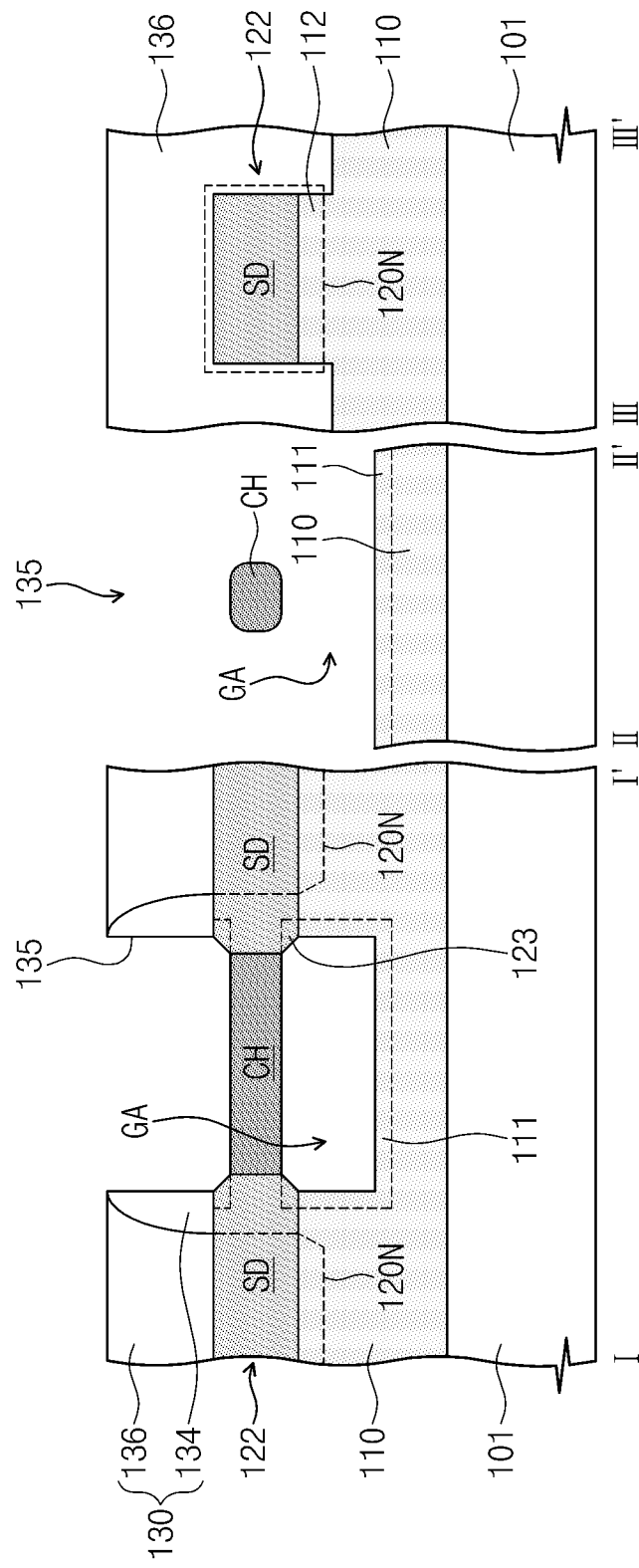

Referring to FIGS. 6A and 6B, after the formation of the gap region GA, a surface treatment process may be performed on the channel region CH. The surface treatment process may be, for example, a Ge condensation process. In one embodiment, the Ge condensation process may include a thermal treatment process to be performed at a temperature of about 600° C. or lower. The Ge condensation process may be performed in an oxidizing atmosphere. For example, the Ge condensation process may be performed in an $N_2O$ ambient. Since silicon is more easily oxidized than germanium, a surface of the channel region CH made of silicon may be selectively oxidized to form a silicon oxide layer. Accordingly, a germanium concentration may be higher in the channel region CH than in the source/drain regions SD. For example, in one embodiment, the channel region CH may contain germanium at a concentration of 60 at % or more, and source/drain regions SD may contain germanium at a concentration of 30 at % or more. Further, the germanium concentration may be higher on the surface of the channel region CH than in an internal portion of the channel region CH. The silicon oxide layer on the surface of the channel region CH may be removed using an etching solution containing hydrofluoric acid (HF). The channel region CH may be rounded by the surface treatment process, and thus, a width of the channel region CH may become smaller than those of the source/drain regions SD. For example, the channel region CH may have a shape of a nano-sized wire. Further, an increase in the germanium concentration of the SRB layer 110 caused by the surface treatment process may be greater at an outer portion 111 adjacent to the gap region GA than at an internal portion apart from the gap region GA. Accordingly, the germanium concentration of the SRB layer 110 may be higher at the outer portion 111 adjacent to the gap region GA than at the internal portion apart from the gap region GA. In addition, an increase in the germanium concentration of the source/drain regions SD may be greater at portions 123 adjacent to the gap region GA than at other portions apart from the gap region GA, and thus, the portions 123 adjacent to the gap region GA may have a higher germanium concentration than the other portions apart from the gap region GA.

Figure 7A:
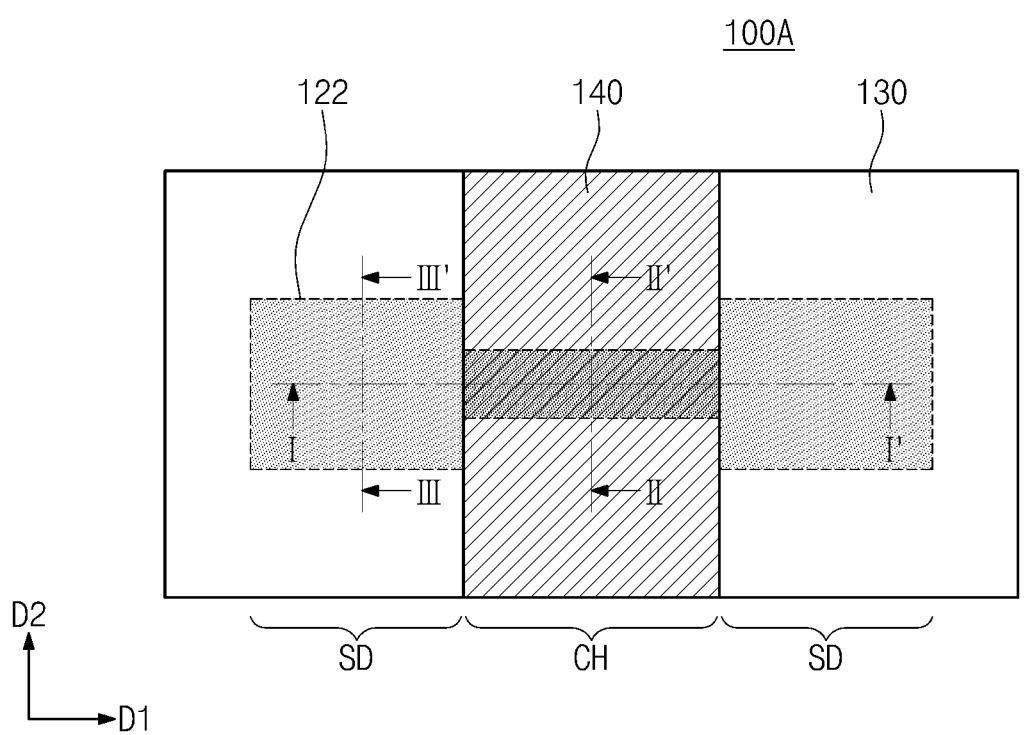

Referring to FIGS. 7A and 7B, a gate electrode 140 may be formed in the gate region 135. The gate electrode 140 may extend parallel to the second direction, which may be substantially perpendicular to an extension direction of the upper semiconductor pattern 122. The gate electrode 140 may be formed to cover top and side surfaces of the upper semiconductor pattern 122. Further, the gate electrode 140 may extend into the gap region GA to cover a bottom surface of the upper semiconductor pattern 122. Therefore, the gate electrode 140 may be formed to enclose the channel region CH. The gate electrode 140 may include at least one of a doped silicon layer, conductive metal nitride layers, or metal layers.

Before the formation of the gate electrode 140, a gate insulating layer 142 may be formed between the gate region 135 and the gate electrode 140. The gate insulating layer 142 may be interposed between the gate electrode 140 and the insulating spacer 134 and between the gate electrode 140 and the SRB layer 110. The gate insulating layer 142 may include a silicon oxide layer. In other example embodiments, the gate insulating layer 142 may include a high-k dielectric material, whose dielectric constant is higher than that of the silicon oxide layer. For example, the gate insulating layer 142 may include at least one of $HfO_2$, $ZrO_2$, or $Ta_2O_5$.

Hereinafter, the semiconductor device 100A according to example embodiments of the inventive concept will be described with reference to FIGS. 7A and 7B. The semiconductor device 100A may include the SRB layer 110 on the substrate 101, the upper semiconductor pattern 122, which is provided on the SRB layer 110 and includes a pair of source/drain regions SD and the channel region CH connecting the pair of source/drain regions SD, and the gate electrode 140 enclosing the channel region CH. According to example embodiments of the inventive concept, the source/drain regions SD, the channel region CH, and the gate electrode 140 may constitute a transistor TR of the semiconductor device 100A.

The substrate 101 may be a silicon-containing semiconductor wafer or a silicon-on-insulator (SOI) wafer. The substrate 101 may have the first conductivity type. The SRB layer 110 may be a silicon germanium layer, whose germanium concentration is 30 at % or less. The SRB layer 110 may be provided to define the gap region GA adjacent to the channel region CH. The germanium concentration of the SRB layer 110 may be higher at a portion 111 adjacent to the gap region GA than at other portions apart from the gap region GA.

The upper semiconductor pattern 122 may extend in the first direction D1. The source/drain regions SD may be a silicon germanium layer, whose germanium concentration is 30 at % or more. The channel region CH may be a silicon germanium layer, whose germanium concentration is higher than that of the source/drain regions SD. For example, the channel region CH may be a silicon germanium layer, whose germanium concentration is 60 at % or more. The germanium concentration may be higher on the surface of the channel region CH than in an internal portion of the channel region CH. The channel region CH may have a smaller width than the source/drain regions SD. For example, the channel region CH may have a shape of a nano-sized wire. The germanium concentration of the source/drain regions SD may be higher at portions 123 adjacent to the gap region GA than at other portions apart from the gap region GA.

The lower semiconductor pattern 112 below each of the source/drain regions SD may be provided between the SRB layer 110 and the upper semiconductor pattern 122. The lower semiconductor pattern 112 may include the same material as the SRB layer 110. The lower semiconductor pattern 112 may have a sidewall aligned with that of the upper semiconductor pattern 122.

The impurity regions 120N with the second conductivity type may be formed in the source/drain regions SD of the upper semiconductor pattern 122. The impurity regions 120N may extend into the lower semiconductor pattern 112.

The gate electrode 140 may extend parallel to the second direction D2, which may be substantially perpendicular to an extension direction of the upper semiconductor pattern 122. The gate electrode 140 may be provided to enclose the channel region CH. The channel region CH may be provided to penetrate the gate electrode 140. The gate electrode 140 may extend into the gap region GA or below the channel region CH. The gate electrode 140 may include at least one of a doped silicon layer, conductive metal nitride layers, or metal layers.

The interlayered insulating layer 136 may be provided on the upper semiconductor pattern 122 at both sides of the gate electrode 140. The insulating spacer 134 may be provided between the gate electrode 140 and the interlayered insulating layer 136. The interlayered insulating layer 136 and the insulating spacer 134 may constitute the insulating pattern 130.

The gate insulating layer 142 may be provided between the gate electrode 140 and the channel region CH. The gate insulating layer 142 may be interposed between the gate electrode 140 and the insulating spacer 134 and between the gate electrode 140 and the SRB layer 110. The gate insulating layer 142 may include a silicon oxide layer. In other example embodiments, the gate insulating layer 142 may include a high-k dielectric material, whose dielectric constant is higher than that of the silicon oxide layer. As an example, the gate insulating layer 142 may include at least one of $HfO_2$, $ZrO_2$, or $Ta_2O_5$.

The transistor TR may be formed to have a gate-all-around structure. As an example, the channel region CH may be a nano wire structure having a width ranging from several nanometers to several ten nanometers. Such a structure of the channel region CH may contribute to prevent a short channel effect from occurring in the transistor TR. According to the conventional technology, a transistor TR with a nano-sized channel may suffer from a low driving current. By contrast, according to example embodiments of the inventive concept, since the channel region CH contains germanium at a high concentration (for example, 60 at % or more), it is possible to increase mobility of electric charges passing through the channel region CH. Accordingly, even when the transistor TR has the nano-sized channel, the transistor TR can have a property of large driving current.

FIGS. 8A through 12A are plan views illustrating a method of fabricating a semiconductor device 100B according to other example embodiments of the inventive concept, and FIGS. 8B through 12B are sectional views taken along lines I-I', II-II', and III-III' of FIGS. 8A through 12A, respectively.

Figure 8A:
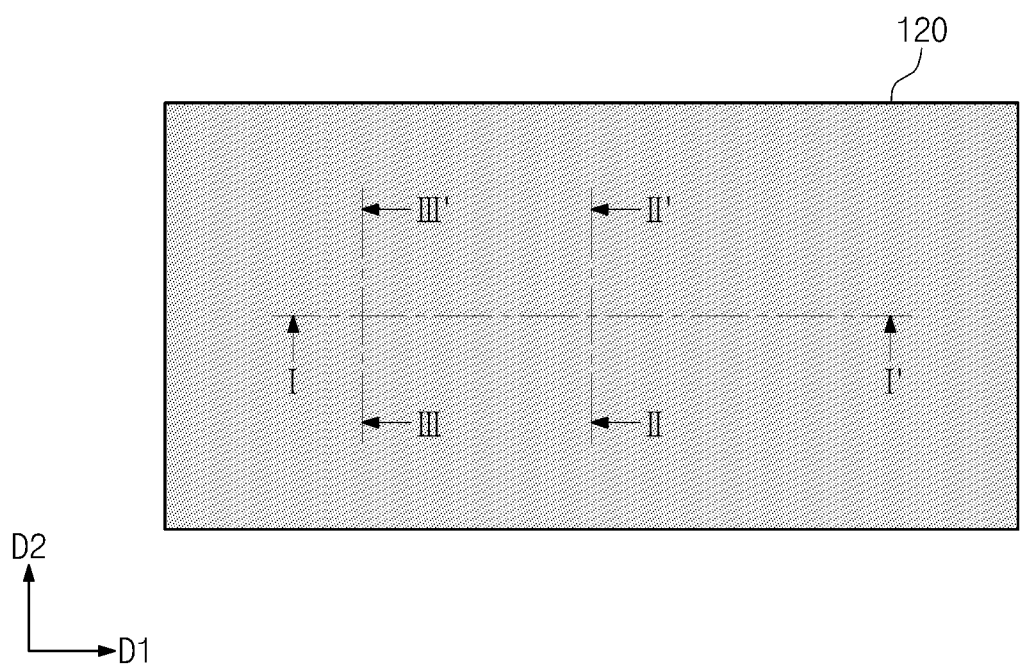
Figure 8B:
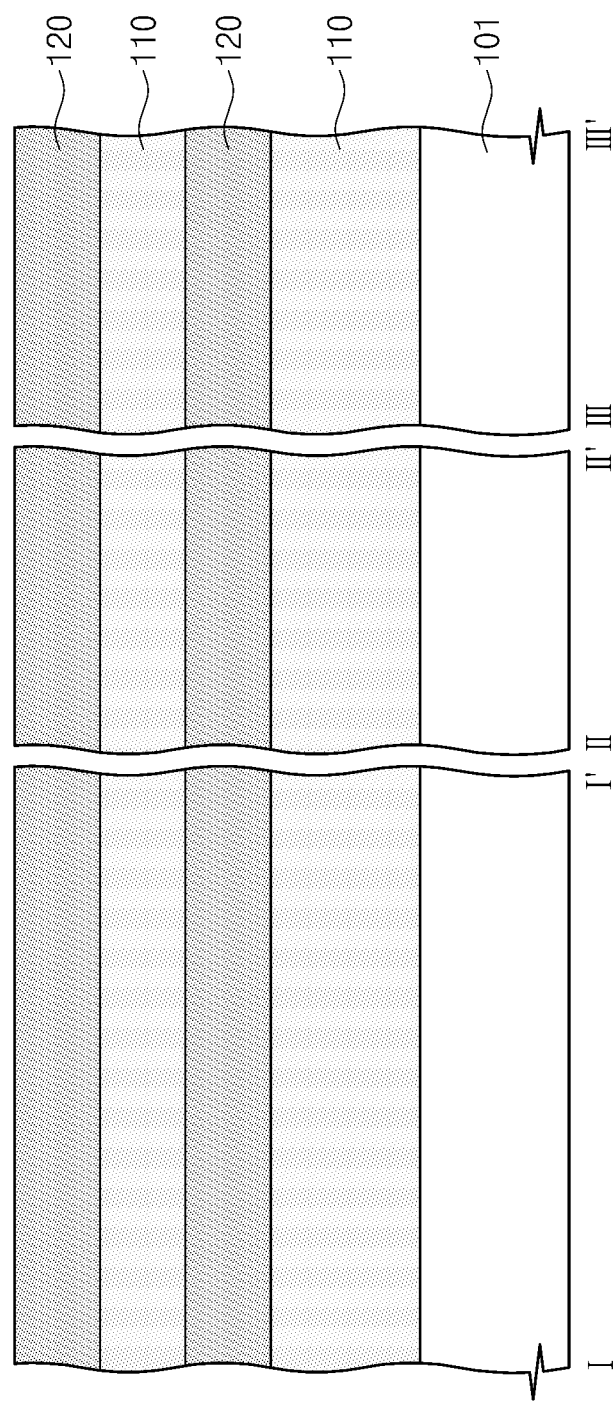

Referring to FIGS. 8A and 8B, a plurality of strain relaxed buffer (SRB) layers 110 and a plurality of semiconductor layers 120 may be alternatingly stacked on the substrate 101 using, for example, the method described with reference to FIGS. 1A and 1B.

Figure 9A:
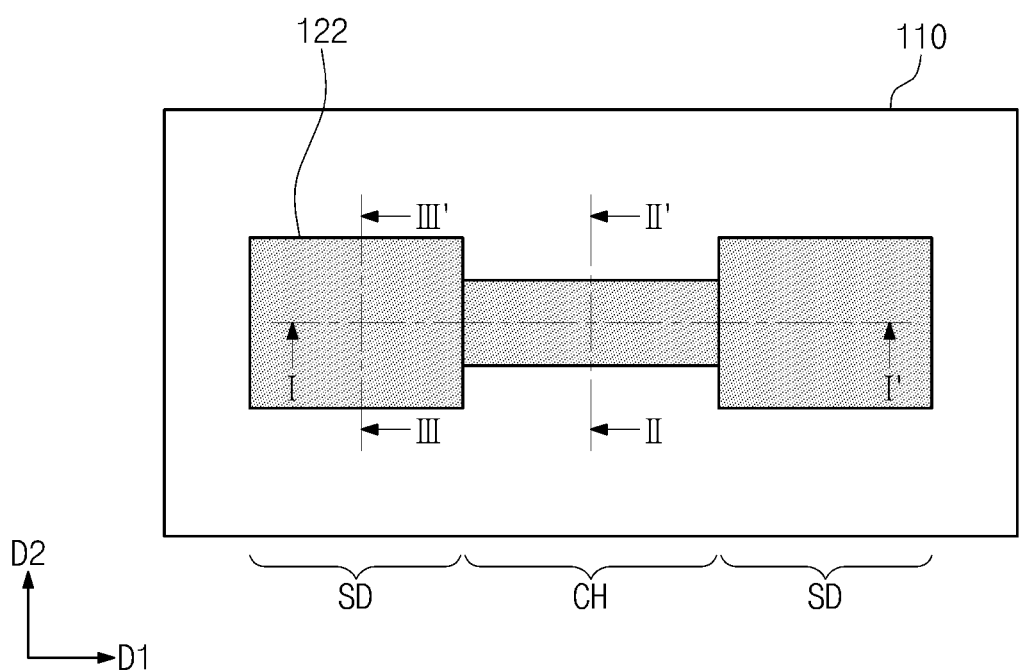
Figure 9B:
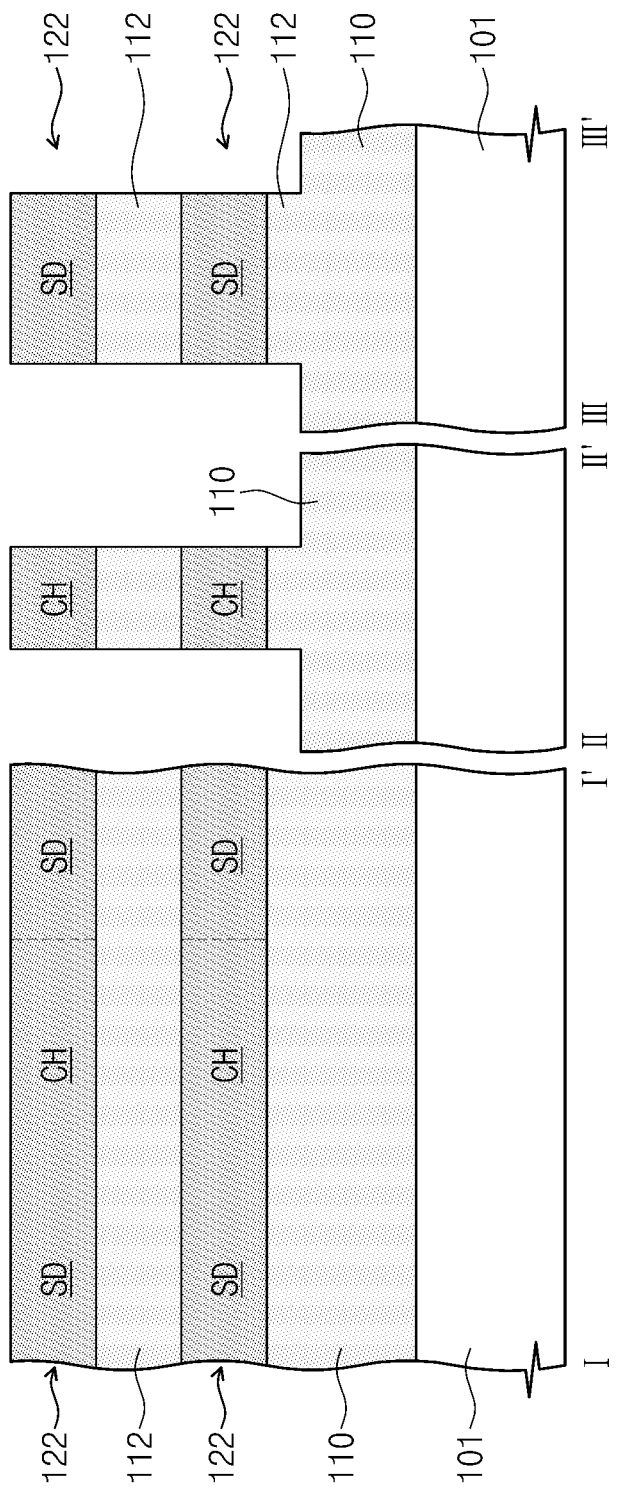
Figure 10A:
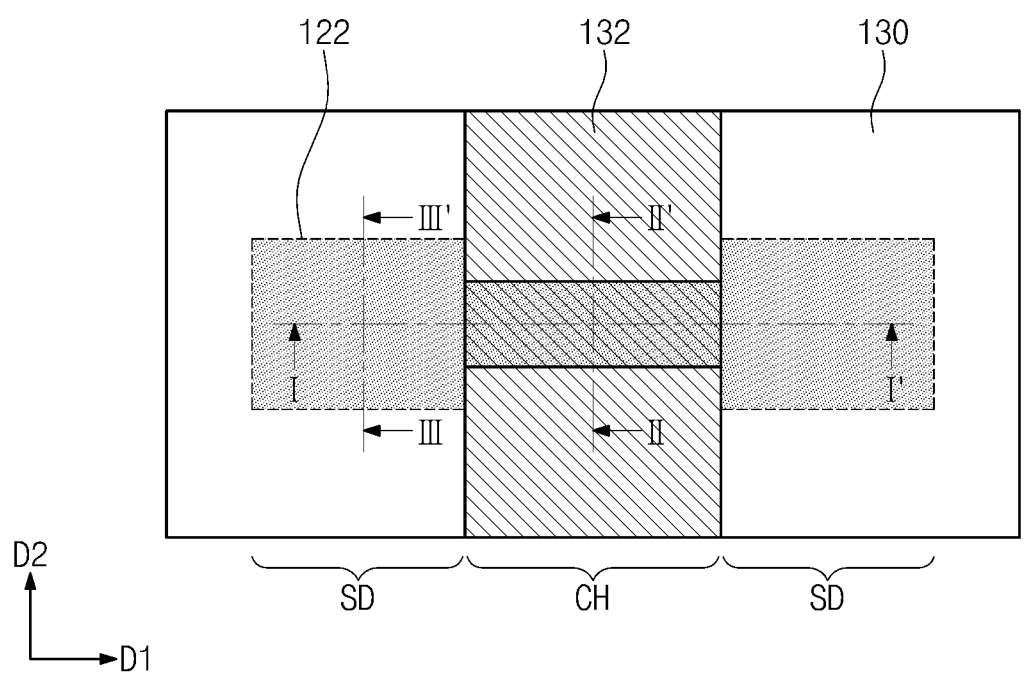
Figure 10B:
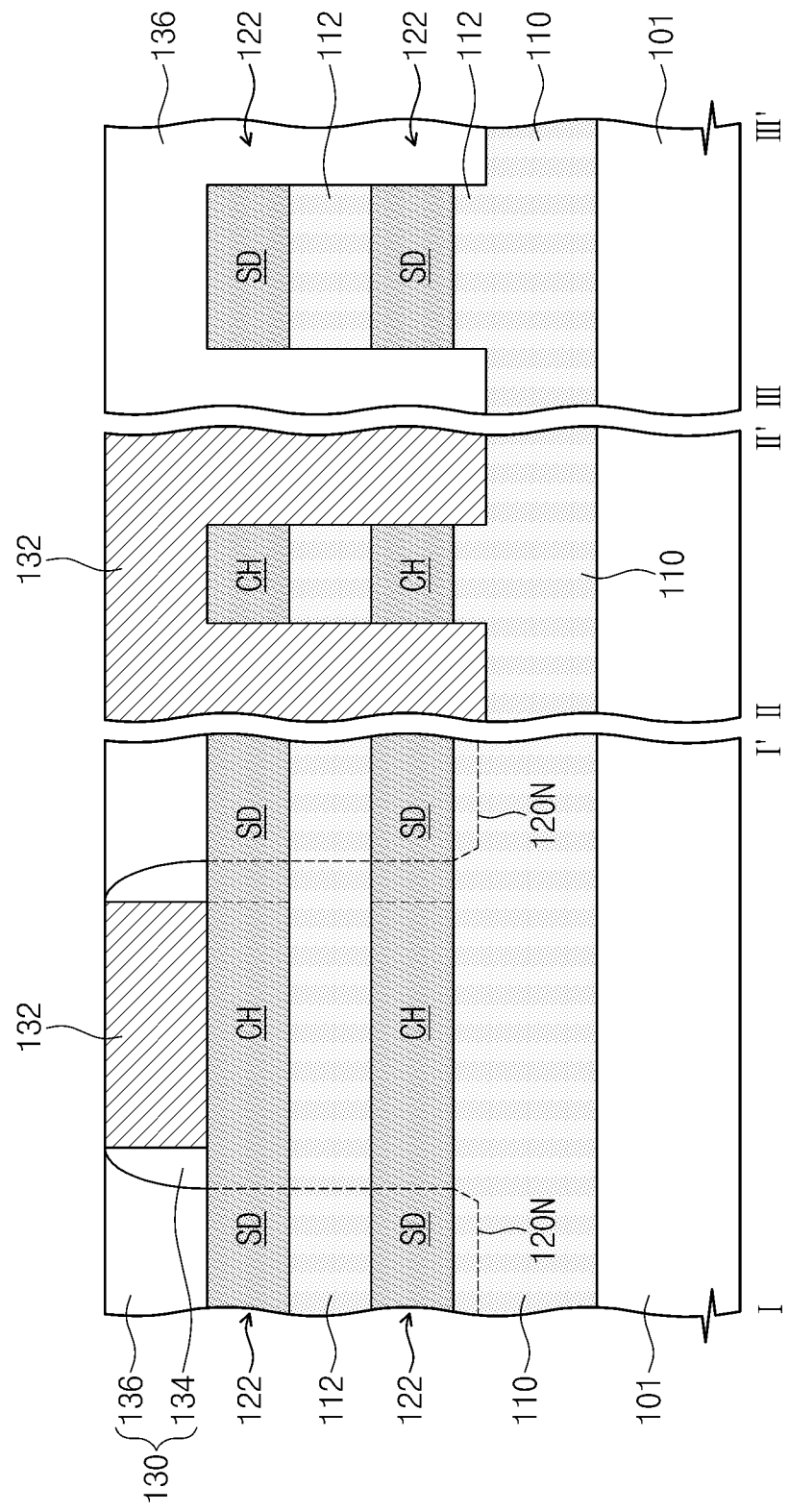
Figure 11A:
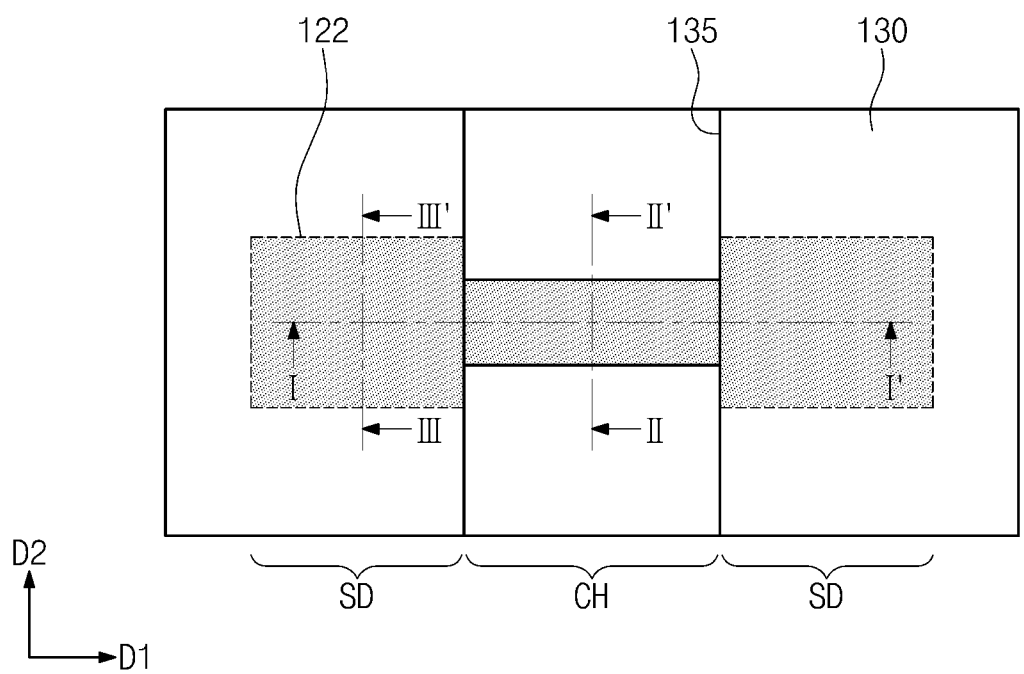
Figure 11B:
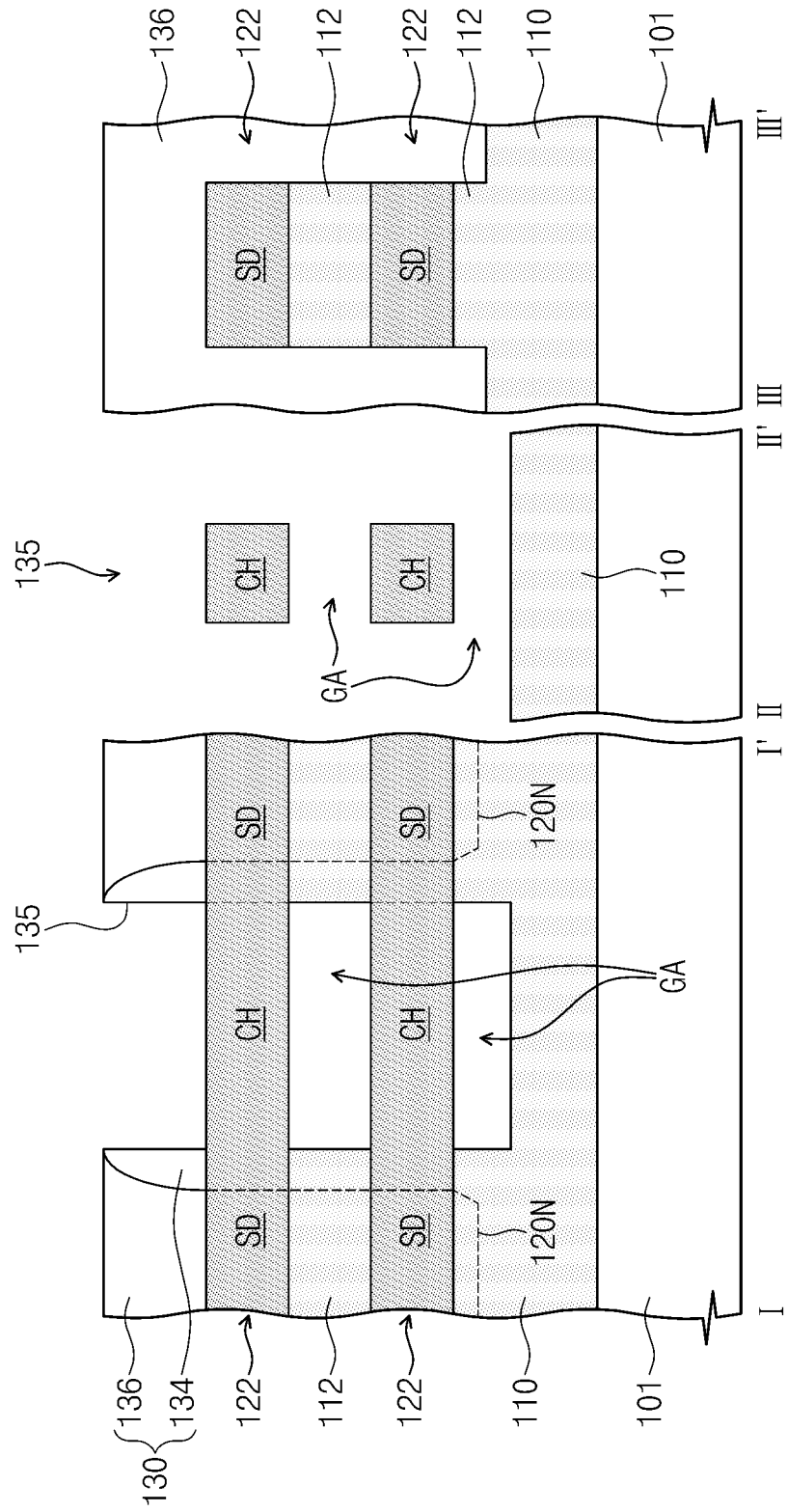

Referring to FIGS. 9A and 9B, the semiconductor layers 120 and the SRB layer 110 may be patterned to form upper semiconductor patterns 122 and lower semiconductor patterns 112. The upper and lower semiconductor patterns 122 and 112 may be formed by a patterning process using a second mask pattern as an etch mask, and here, the second mask pattern may include at least one of a photoresist layer, a silicon nitride layer, a silicon oxide layer, or a silicon oxynitride layer. Each of the upper semiconductor patterns 122 may include the source/drain regions SD and the channel region CH therebetween. The lower semiconductor pattern 112 may be formed between the SRB layer 110 and the lowermost one of the upper semiconductor patterns 122. Thereafter, the second mask pattern may be removed.

Referring to FIGS. 10A, 10B, 11A, and 11B, the insulating pattern 130 may be formed on the upper semiconductor patterns 122. The insulating pattern 130 may include the insulating spacer 134 and the interlayered insulating layer 136. The insulating pattern 130 may be formed to define the gate region 135 exposing the channel regions CH and extending in the second direction D2 or across the first direction D1. The insulating pattern 130 may cover the source/drain regions SD of the upper semiconductor patterns 122.

For example, by using the method described with reference to FIGS. 3A and 3B, the dummy gate 132 may be formed to cover the channel region CH of the upper semiconductor pattern 122. The dummy gate 132 may extend in the second direction D2. The dummy gate 132 may be formed to expose the source/drain regions SD of the upper semiconductor pattern 122. The dummy gate 132 may be formed of or include a polysilicon layer, a silicon nitride layer, or a silicon oxynitride layer. Thereafter, the insulating spacer 134 may be formed on sidewalls of the dummy gate 132. The insulating spacer 134 may include a material having an etch selectivity with respect to the dummy gate 132. As an example, the insulating spacer 134 may include at least one of a silicon oxide layer, a silicon nitride layer, or a silicon oxynitride layer.

Impurities may be injected into the source/drain regions SD using the dummy gate 132 and the insulating spacer 134 as a mask, and thus, the impurity regions 120N of the second conductivity type may be formed in the source/drain regions SD. The impurity regions 120N may extend from the source/drain regions SD of the upper semiconductor pattern 122 into an upper portion of the lower semiconductor pattern 112.

Referring back to FIGS. 11A and 11B, the lower semiconductor patterns 112 may be partially removed to form the gap region GA between or around the channel regions CH of the upper semiconductor patterns 122. The removal of the lower semiconductor patterns 112 may be performed using, for example, the same or similar method as described with reference to FIGS. 5A and 5B or its modification. The gap region GA may be formed to expose top and bottom surfaces of the channel regions CH of the upper semiconductor patterns 122.

Figure 12A:
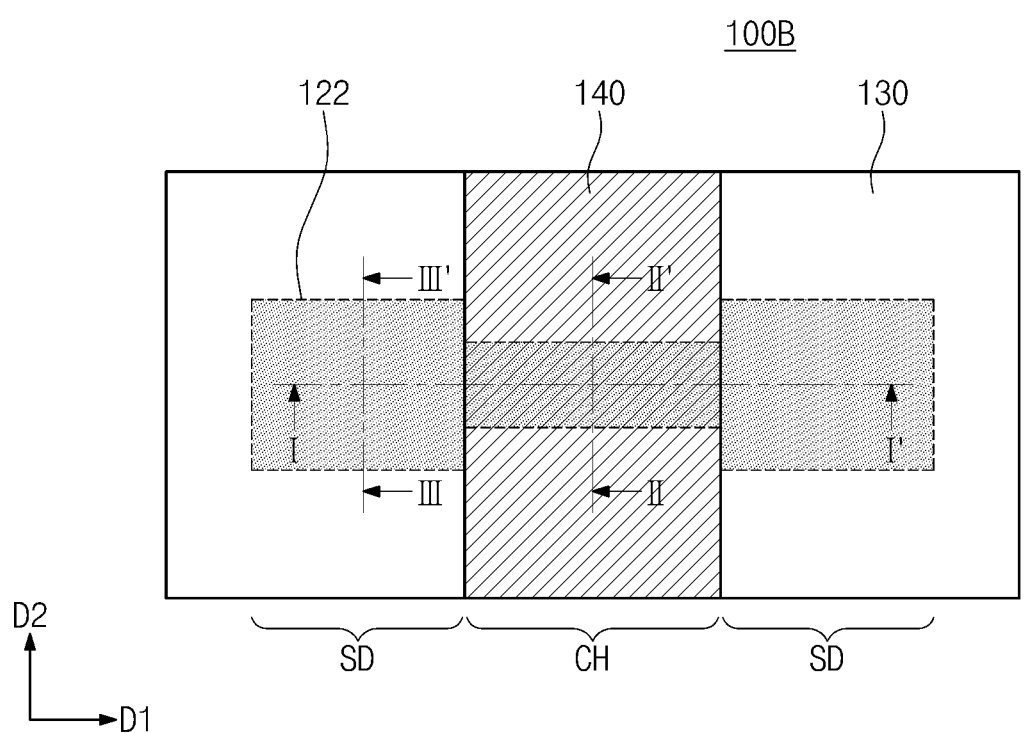
Figure 12B:
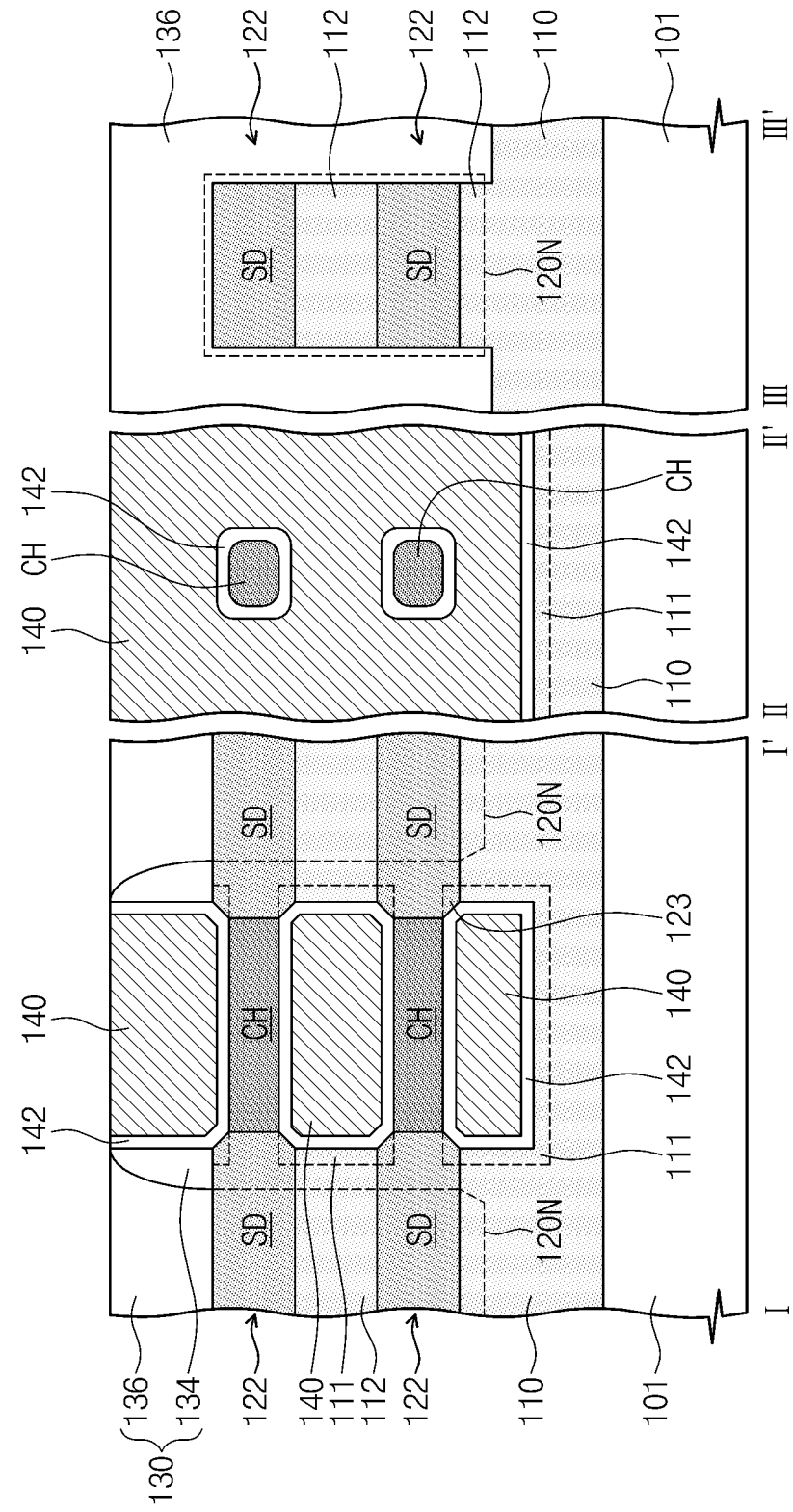

Referring to FIGS. 12A and 12B, after the formation of the gap region GA, a surface treatment process may be performed on the channel regions CH. The surface treatment process may be a Ge condensation process. The gate electrode 140 may be formed in the gate region 135 using, for example, the previously described method of the previous embodiment.

According to other example embodiments of the inventive concept, as shown in FIGS. 12A and 12B, the transistor of the semiconductor device 100B may include a plurality of the upper semiconductor patterns 122. This makes it possible to increase a total area of the channel region of the transistor and increase a mobility of electric charges passing therethrough.

FIGS. 13A through 19A are plan views illustrating a method of fabricating a semiconductor device 100C according to still other example embodiments of the inventive concept. FIGS. 13B through 19B are sectional views taken along lines I-I', II-II', and III-III' of FIGS. 13A through 19A, respectively, and FIGS. 13C through 19C are sectional views taken along lines IV-IV', V-V', and VI-VI' of FIGS. 13A through 19A.

Figure 13A:
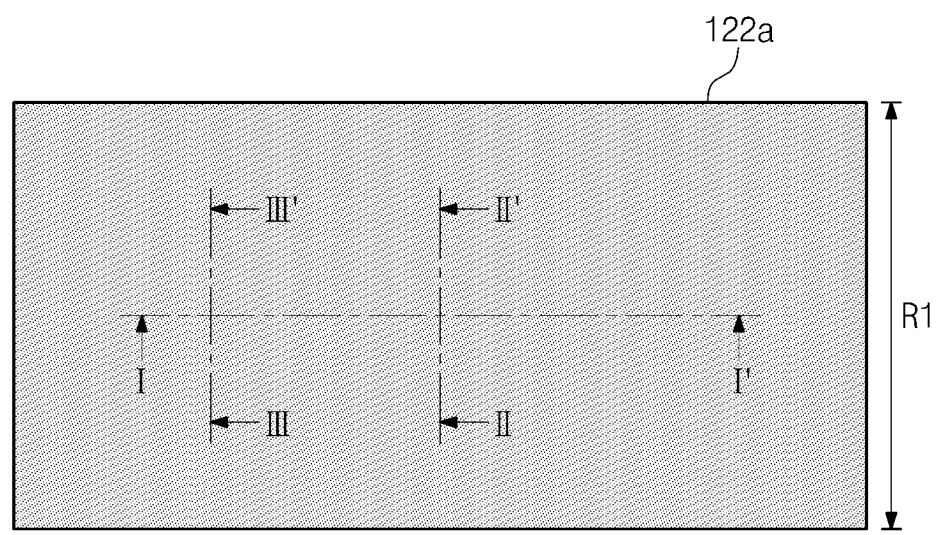
Figure 13A:
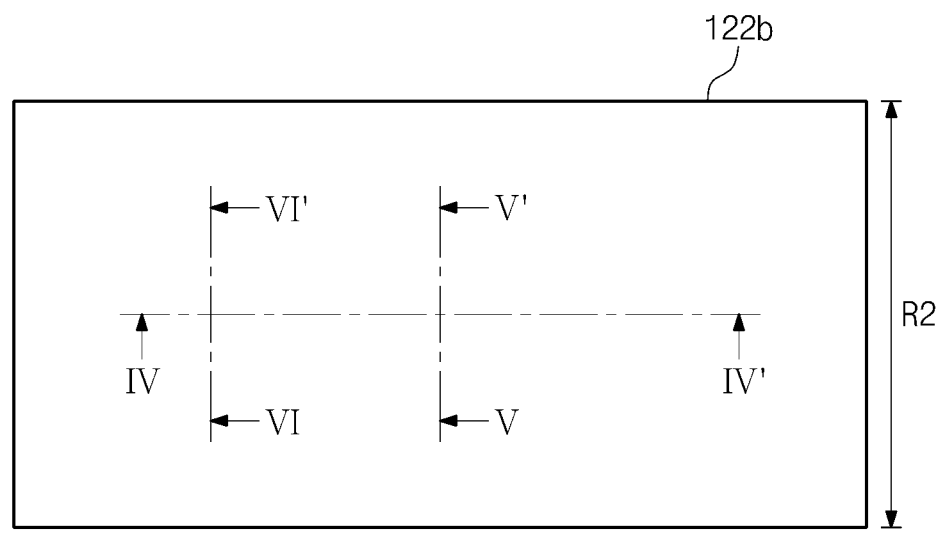
Figure 13A:
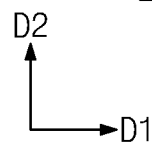
Figure 13B:
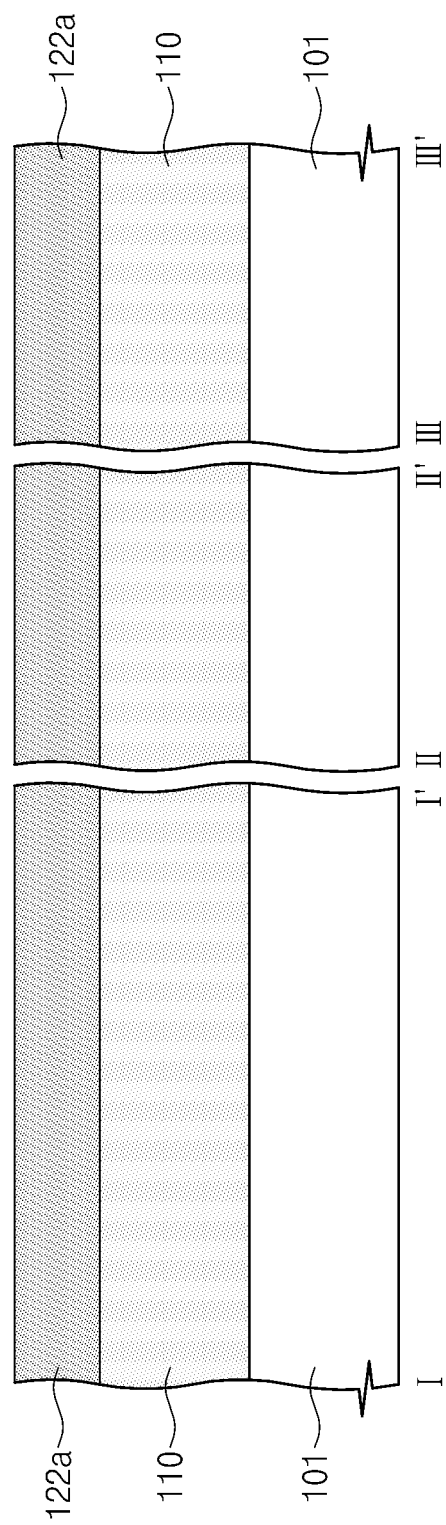
Figure 13C:
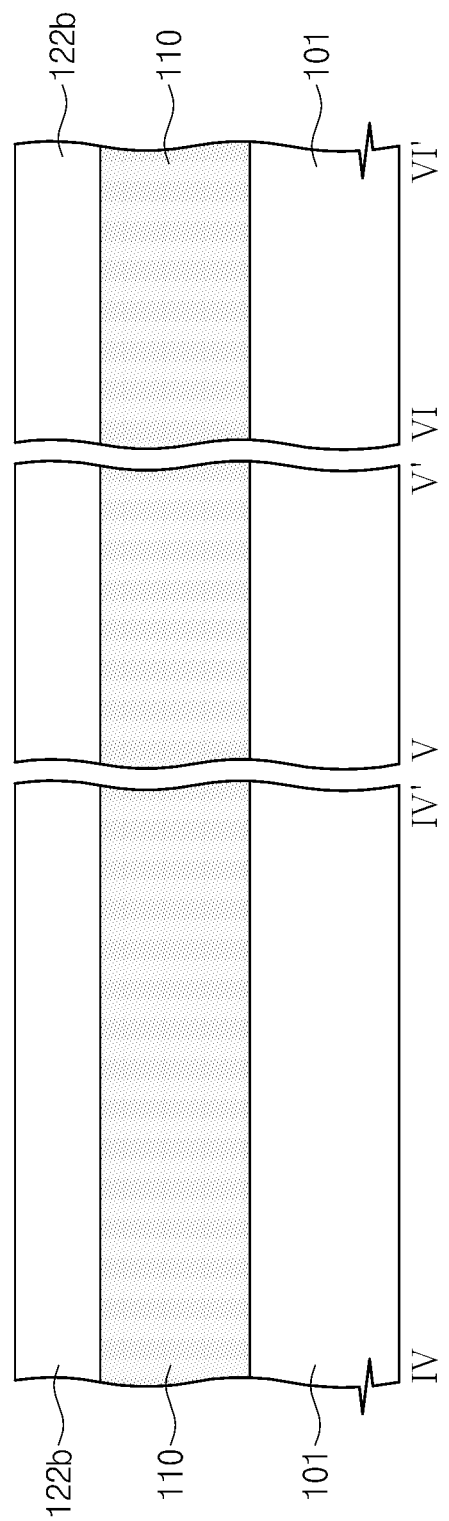

Referring to FIGS. 13A and 13B, the substrate 101 may be provided. The substrate 101 may include a first region R1 and a second region R2. In an embodiment, the first region R1 may be a PMOS region, and the second region R2 may be an NMOS region. The substrate 101 may be a silicon-containing semiconductor wafer or a silicon-on-insulator (SOI) wafer. The substrate 101 may have a first conductivity type.

The SRB layer 110 may be formed on the substrate 101 using, for example, the method described with reference to FIGS. 1A and 1B. The SRB layer 110 may be formed by an epitaxial growth process using the substrate 101 as a seed layer. For example, the epitaxial growth process for forming the SRB layer 110 may be a chemical vapor deposition (CVD) process or a molecular beam epitaxy (MBE) process. A first semiconductor layer 120a may be formed on the SRB layer 110. The first semiconductor layer 120a may be formed by an epitaxial growth process using the SRB layer 110 as a seed layer. For example, the epitaxial growth process for forming the first semiconductor layer 120a may be a chemical vapor deposition (CVD) process or a molecular beam epitaxy (MBE). The SRB layer 110 and the first semiconductor layer 120a may be successively formed in the same chamber.

The SRB layer 110 and the first semiconductor layer 120a may be, for example, a silicon germanium layer. The SRB layer 110 may facilitate a process of growing the first semiconductor layer 120a from the substrate 101, which may be formed of silicon. The SRB layer 110 may contain germanium at a lower concentration than the first semiconductor layer 120a. In one embodiment, the SRB layer 110 may contain germanium at a concentration of 30 at % or less. The first semiconductor layer 120a may contain germanium at a concentration of 30 at % or more. In general, in the case where a germanium concentration of a silicon germanium layer is 30 at % or more, it is a difficult to directly grow such a silicon germanium layer from a silicon layer. In one embodiment, the SRB layer 110 having a germanium concentration of 30 at % or less may be directly grown from the substrate 101 that is made of silicon, and then, the first semiconductor layer 120a of high germanium concentration may be grown from the SRB layer 110 serving as a seed layer. Accordingly, it is possible to grow the first semiconductor layer 120a of high quality and high germanium concentration.

Thereafter, a third mask pattern may be formed to cover the first region R1. The first semiconductor layer 120a of the second region R2 may be removed using the third mask pattern as an etch mask. The third mask pattern may include at least one of a silicon nitride layer, a silicon oxide layer, or a silicon oxynitride layer. The removal of the first semiconductor layer 120a may be performed using a selective etching process capable of selectively removing the first semiconductor layer 120a and preventing the SRB layer 110 from being etched. The etching process may be performed using an etching solution containing peracetic acid. The etching solution may further contain hydrofluoric acid (HF) aqueous solution and deionized water. Accordingly, the SRB layer 110 may be exposed on the second region R2.

When the first region R1 is covered with the third mask pattern, a second semiconductor layer 120b may be locally formed on the second region R2 to cover the SRB layer 110. The second semiconductor layer 120b may be formed by an epitaxial growth process using the SRB layer 110 as a seed layer. For example, the epitaxial growth process for forming the second semiconductor layer 120b may be a chemical vapor deposition (CVD) process or a molecular beam epitaxy (MBE) process. The second semiconductor layer 120b may be formed to contain germanium at a lower concentration than the SRB layer 110. The second semiconductor layer 120b may be, for example, a silicon layer. The third mask pattern may be removed.

Figure 14A:
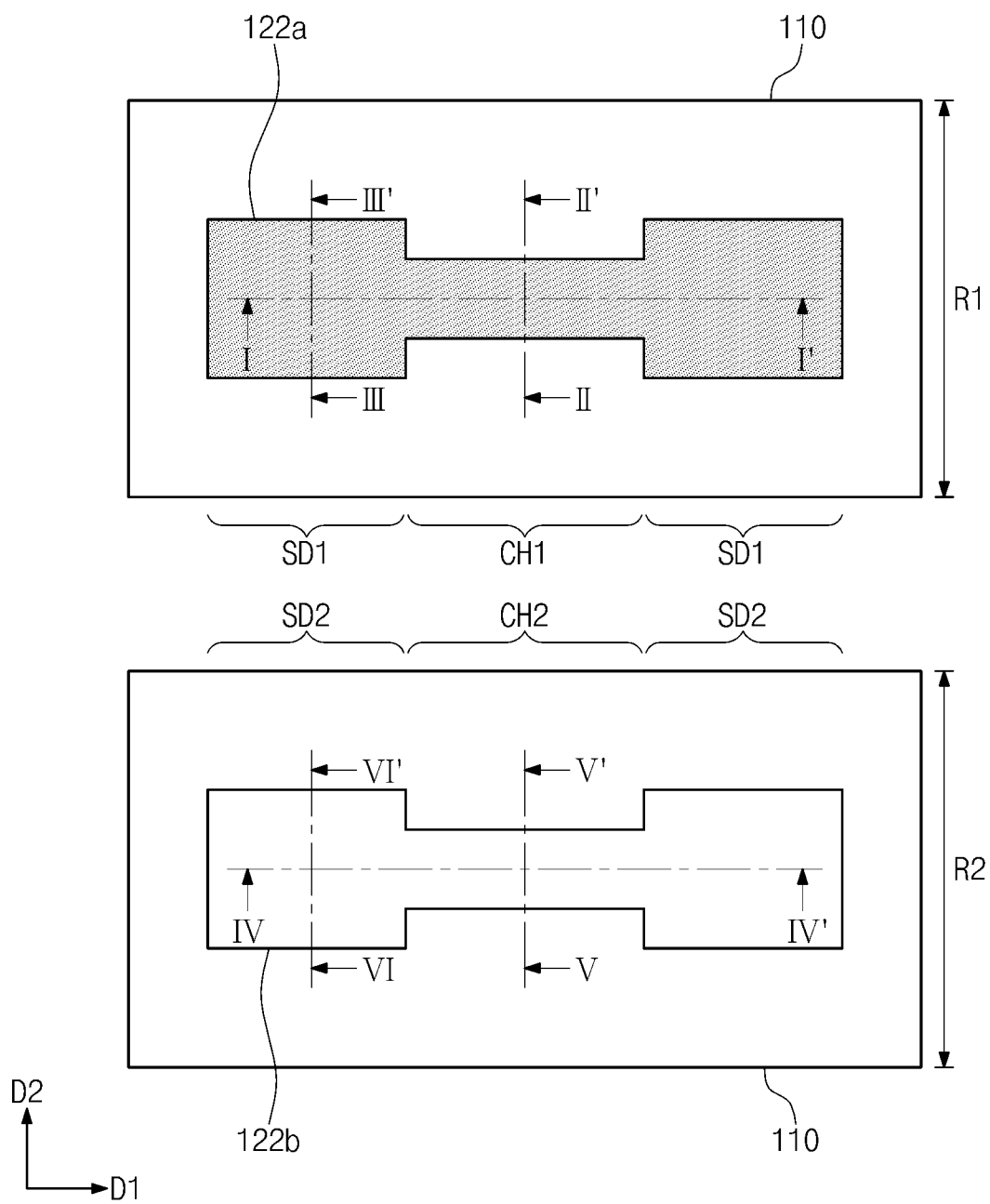
Figure 14B:
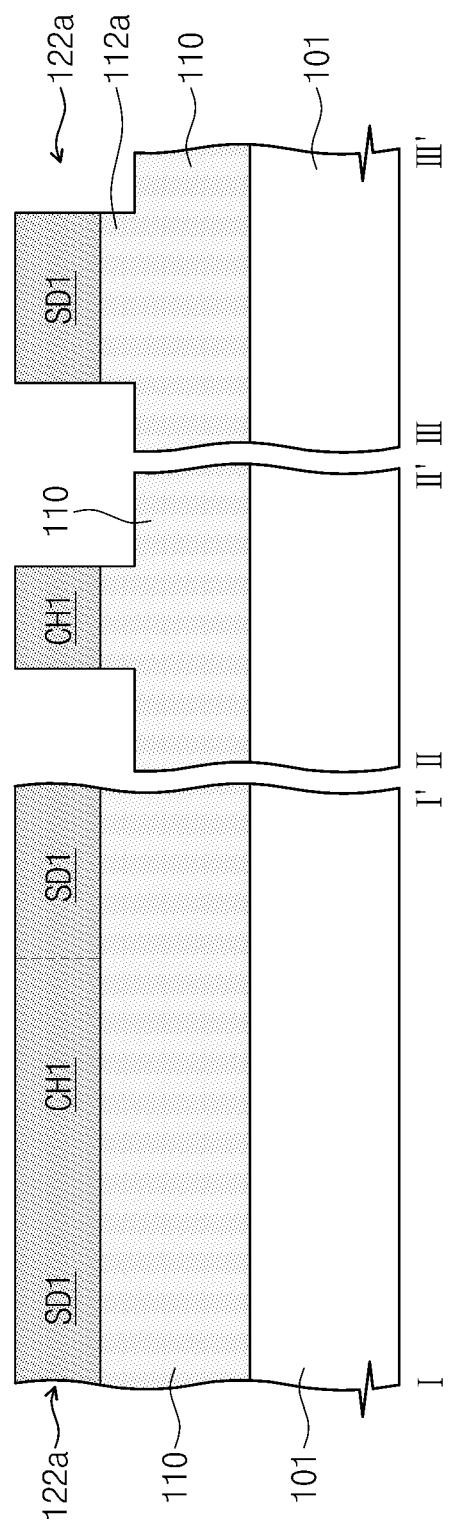
Figure 14C:
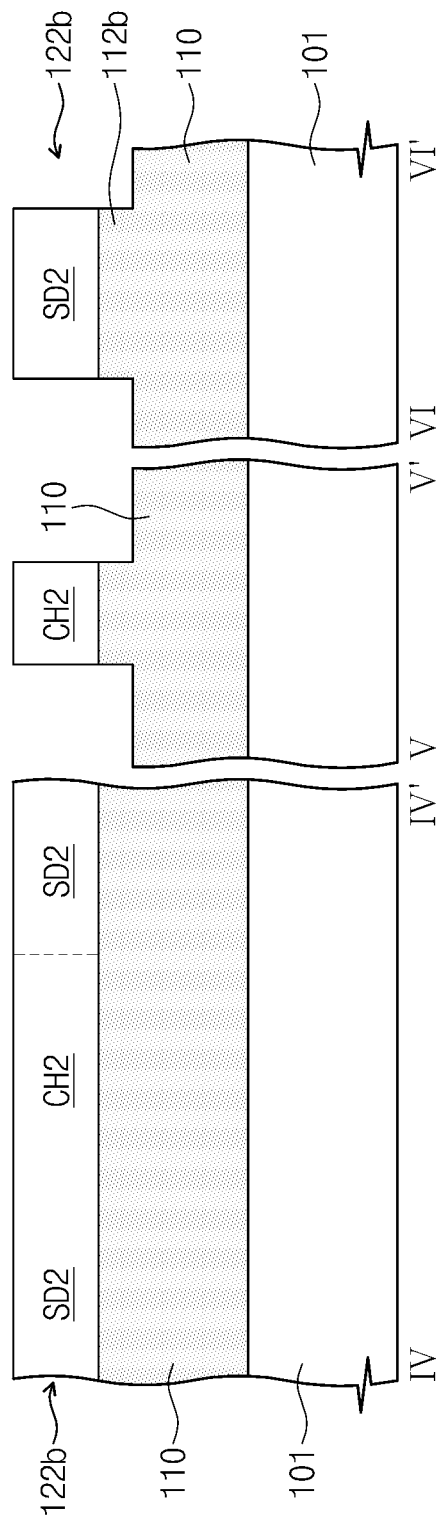

Referring to FIGS. 14A and 14B, fourth mask patterns may be formed on the first and second semiconductor layers 120a and 120b. Each of the fourth mask patterns may extend in the first direction. The fourth mask patterns may include at least one of a photoresist layer, a silicon nitride layer, a silicon oxide layer, or a silicon oxynitride layer.

The first and second semiconductor layers 120a and 120b may be patterned to form a first upper semiconductor pattern 122a and a second upper semiconductor pattern 122b on the first region R1 and the second region R2, respectively. The first and second upper semiconductor patterns 122a and 122b may be formed by a patterning process using the fourth mask patterns as an etch mask. The first upper semiconductor pattern 122a may include first source/drain regions SD1 and a first channel region CH1. The first source/drain regions SD1 may include a first source region and a first drain region spaced apart from each other in the first direction. The first channel region CH1 may connect the first source region to the first drain region. The second upper semiconductor pattern 122b may include second source/drain regions SD2 and a second channel region CH2. The second source/drain regions SD2 may include a second source region and a second drain region spaced apart from each other in the first direction. The second channel region CH2 may connect the second source region to the second drain region. Here, an upper portion of the SRB layer 110 may be patterned to form a first lower semiconductor pattern 112a and a second lower semiconductor pattern 112b on the first region R1 and the second region R2, respectively.

The patterning process may include a dry and/or wet etching process. As an example, the patterning process may be anisotropically performed using a dry etching technology. The fourth mask pattern may be removed after the patterning process. In example embodiments, the removal of the fourth mask patterns may include an ashing process or a wet etching process.

Figure 15A:
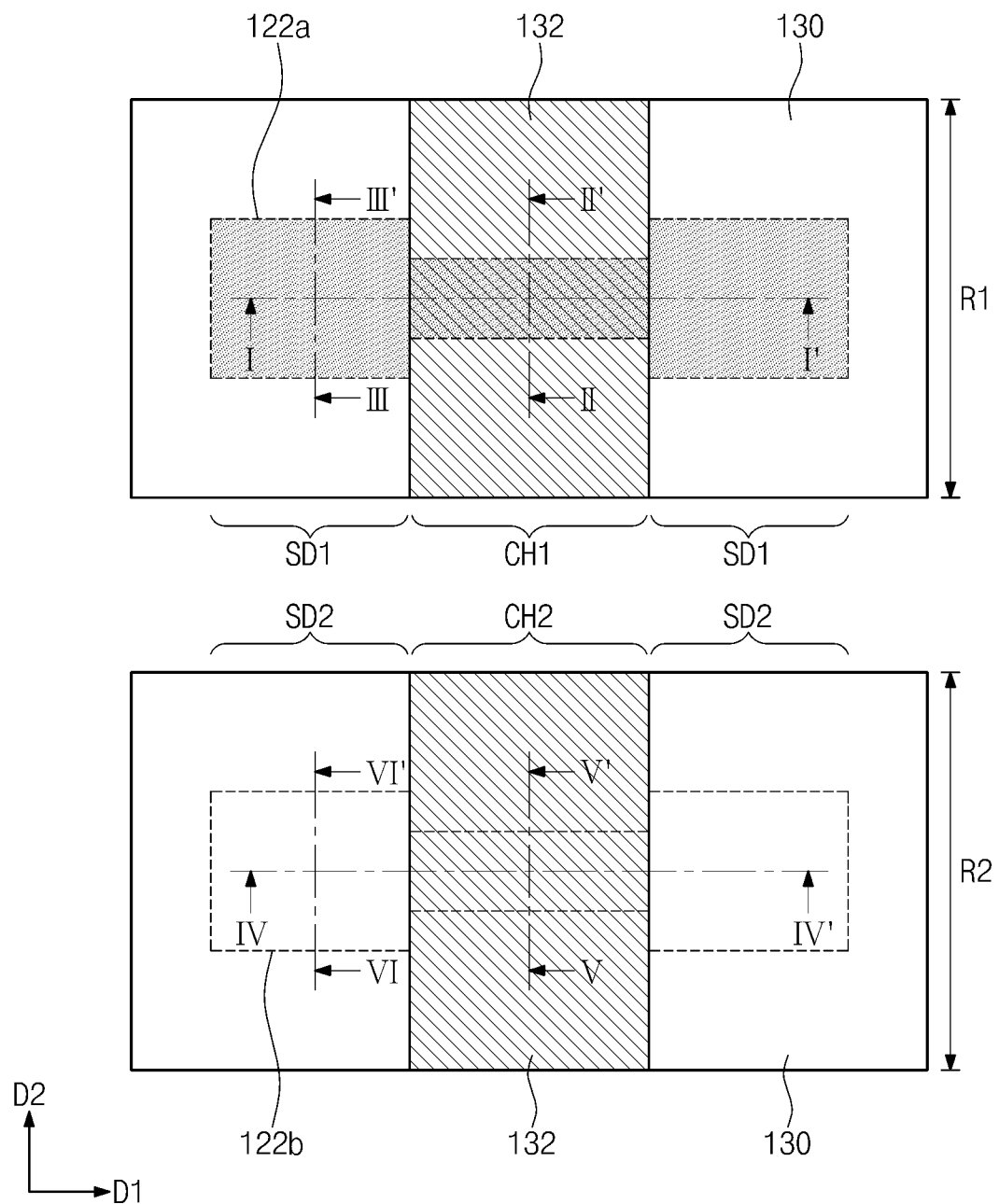
Figure 15B:
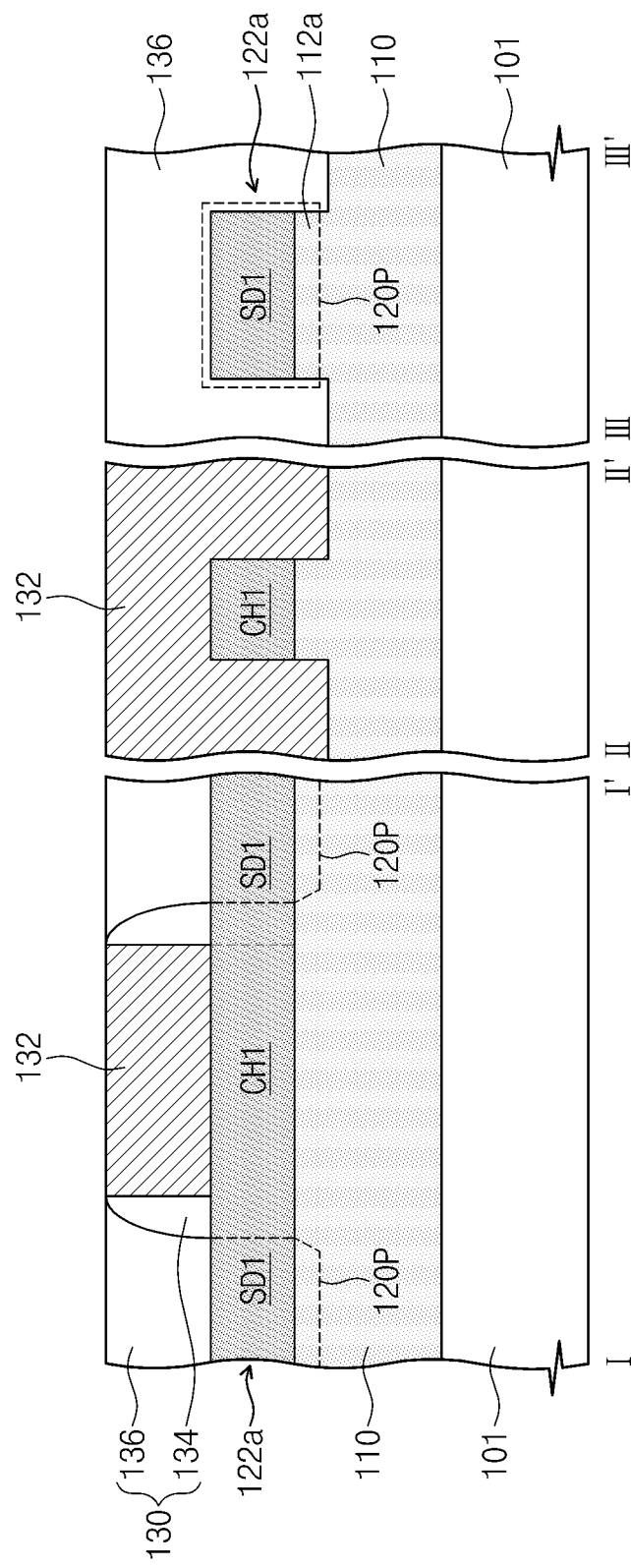
Figure 15C:
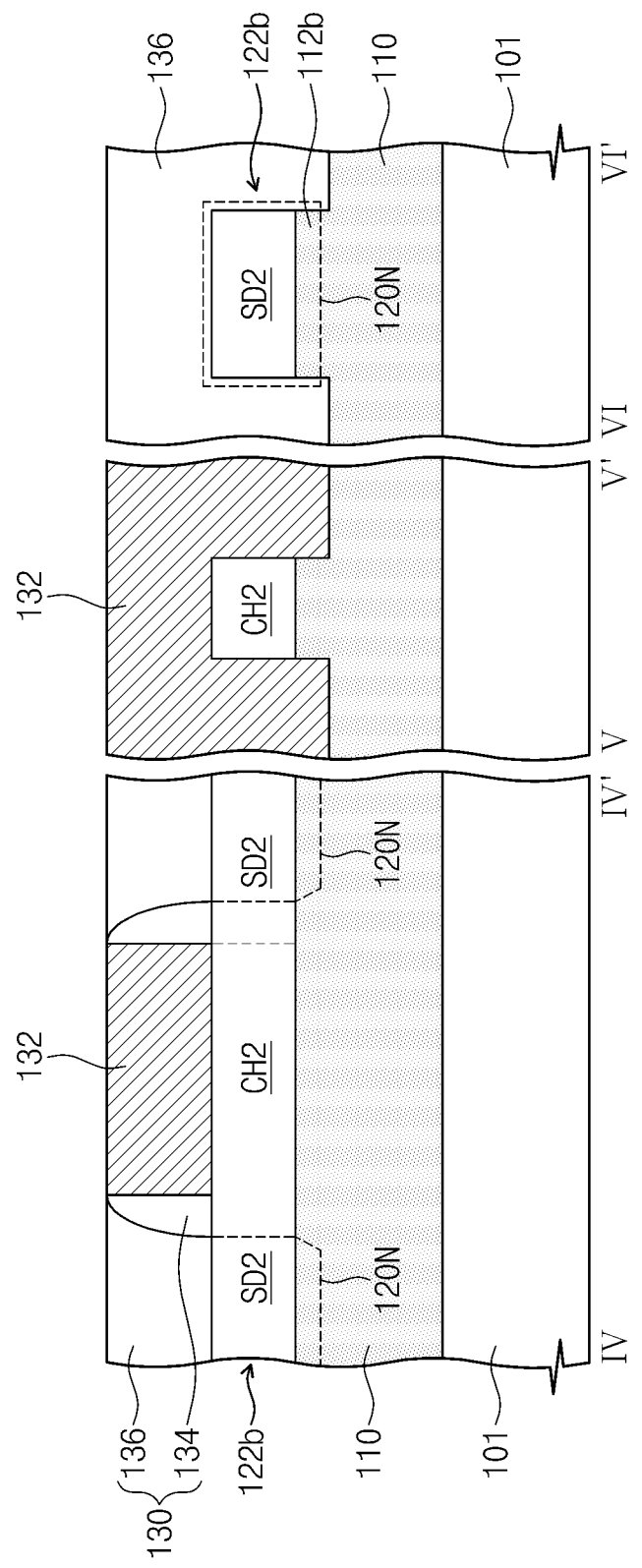

Referring to FIGS. 15A and 15B, dummy gates 132 may be formed to cover the first channel region CH1 of the first upper semiconductor pattern 122a and the second channel region CH2 of the second upper semiconductor pattern 122b. The dummy gates 132 may extend in the second direction or across the first direction. The dummy gates 132 may be formed to expose the first source/drain regions SD1 and the second source/drain regions SD2. The dummy gates 132 may include, for example, at least one of a polysilicon layer, a silicon nitride layer, or a silicon oxynitride layer. The insulating spacer 134 may be formed on sidewalls of the dummy gates 132. The insulating spacer 134 may include a material having an etch selectivity with respect to the dummy gates 132. For example, the insulating spacer 134 may include at least one of a silicon oxide layer, a silicon nitride layer, or a silicon oxynitride layer.

A first mask may be formed to cover the second region R2. Impurities may be injected into the first source/drain regions SD1 using the dummy gate 132 and the insulating spacer 134 as an ion mask, and thus, first impurity regions 120P of the first conductivity type may be formed in the first source/drain regions SD1. The first impurity regions 120P may extend from the first source/drain regions SD1 of the first upper semiconductor pattern 122a into the first lower semiconductor pattern 112a. Next, the first mask may be removed, and a second mask may be formed to cover the first region R1. Impurities may be injected into the second source/drain regions SD2 using the dummy gate 132 and the insulating spacer 134 as an ion mask, and thus, second impurity regions 120N of the second conductivity type may be formed in the second source/drain regions SD2. Here, the second conductivity type may be different from the first conductivity type. The second impurity regions 120N may extend from the second source/drain regions SD2 of the second upper semiconductor pattern 122b into the second lower semiconductor pattern 112b.

The interlayered insulating layer 136 may be formed on the substrate 101. The formation of the interlayered insulating layer 136 may include forming an insulating layer on the substrate 101 using a chemical vapor deposition (CVD) process and performing a planarization process on the insulating layer to expose top surfaces of the dummy gates 132. For example, the interlayered insulating layer 136 may be formed of or include a silicon oxide layer. The insulating spacer 134 and the interlayered insulating layer 136 may constitute the insulating pattern 130.

Figure 16A:
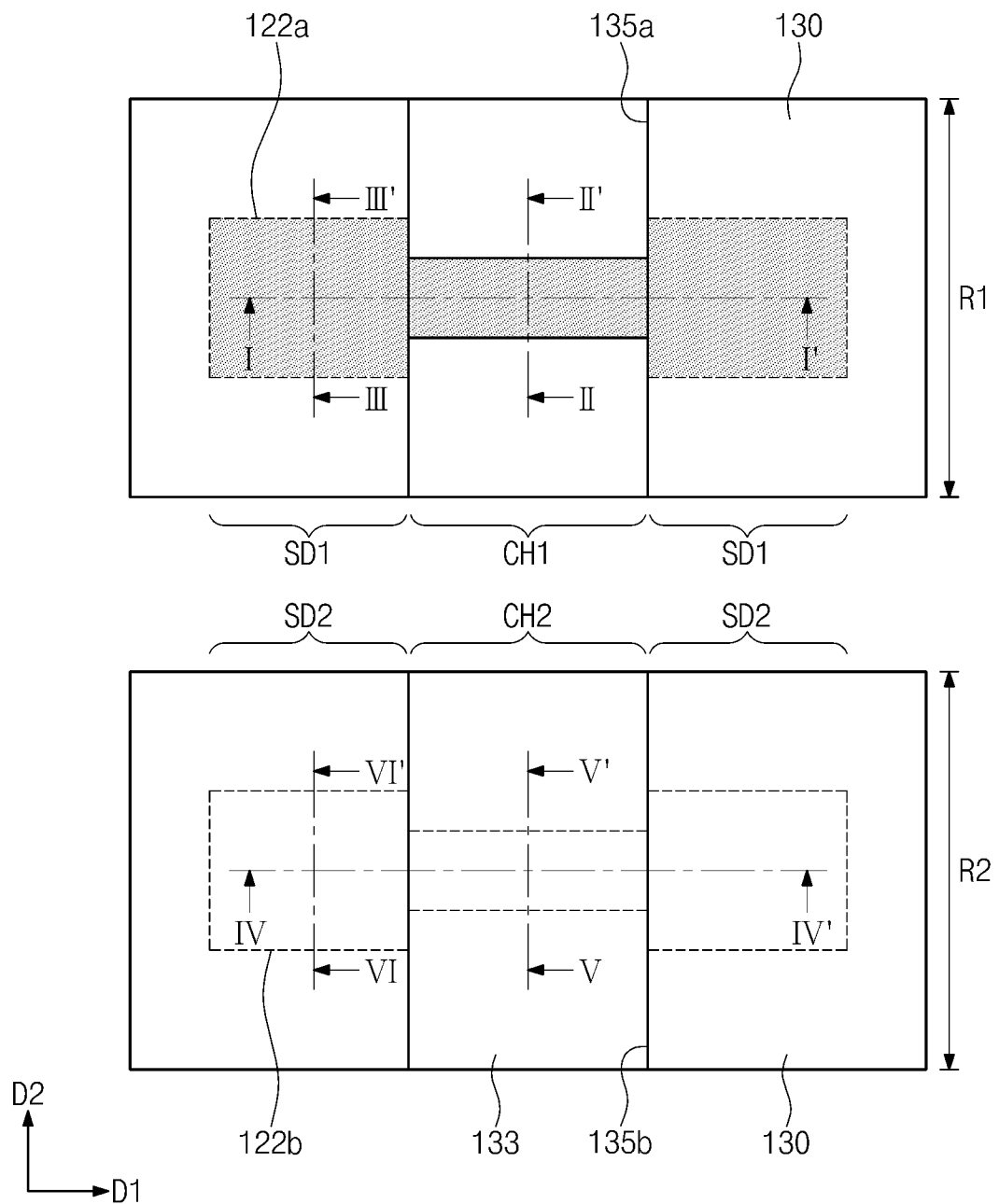
Figure 16B:
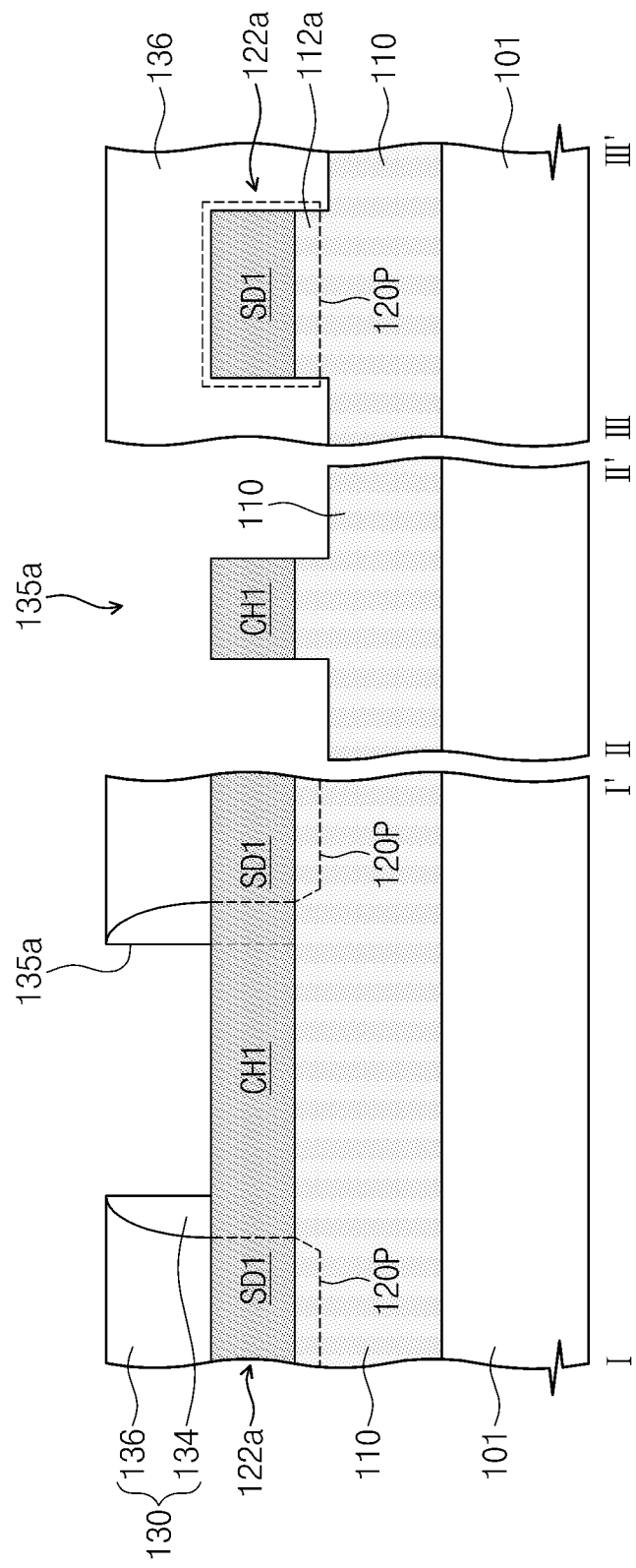
Figure 16C:
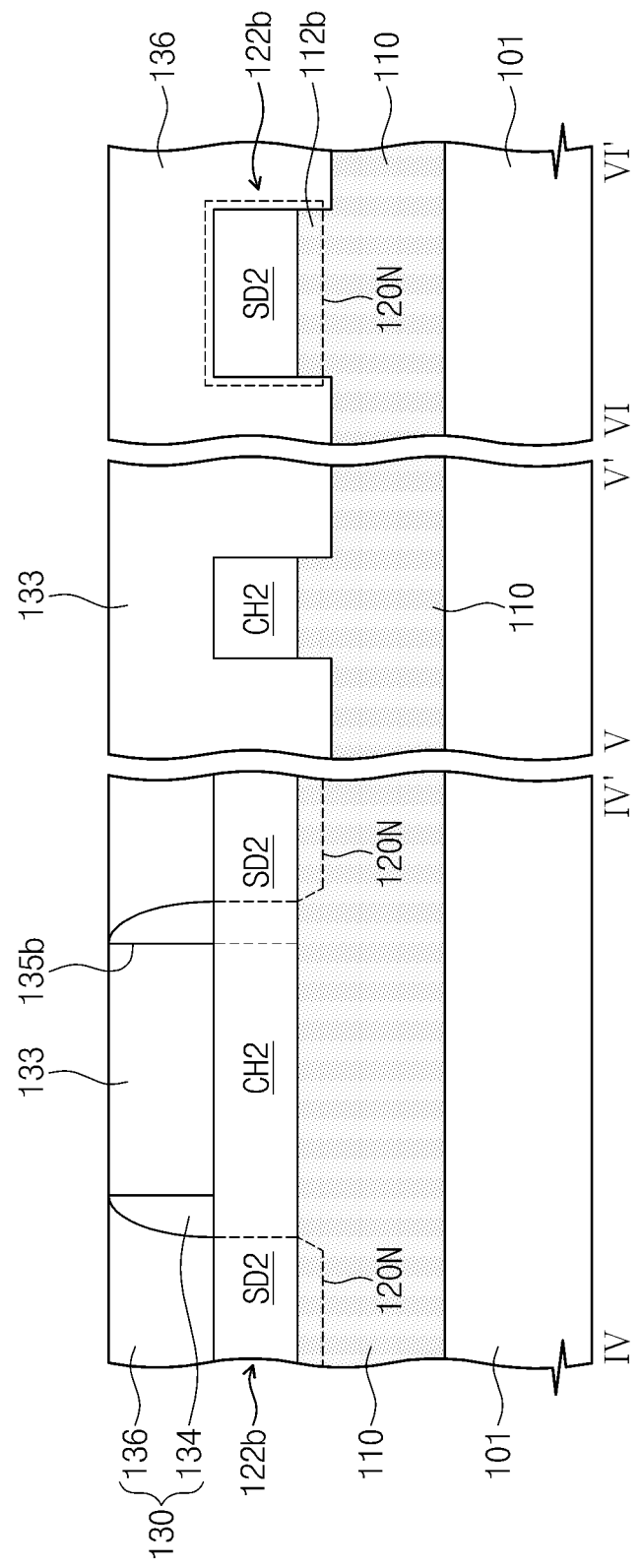

Referring to FIGS. 16A and 16B, the dummy gates 132 may be selectively removed to form a first gate region 135a and a second gate region 135b on the first region R1 and the second region R2, respectively. Accordingly, the insulating spacer 134 and the interlayered insulating layer 136 may expose the first and second channel regions CH1 and CH2. Therefore, the first and second channel regions CH1 and CH2 may be exposed by the first and second gate regions 135a and 135b, respectively.

Next, a fifth mask pattern 133 may be formed on the second gate region 135b. The fifth mask pattern 133 may include a material having an etch selectivity with respect to the interlayered insulating layer 136, the insulating spacer 134, and the first and second upper semiconductor patterns 122a and 122b. As an example, the fifth mask pattern 133 may include at least one of silicon oxide, silicon nitride, and silicon oxynitride. Alternatively, the dummy gate 132 may not be removed from the second region R2. As such, in one embodiment, the dummy gate 132 may remain on the second region R2.

Figure 17A:
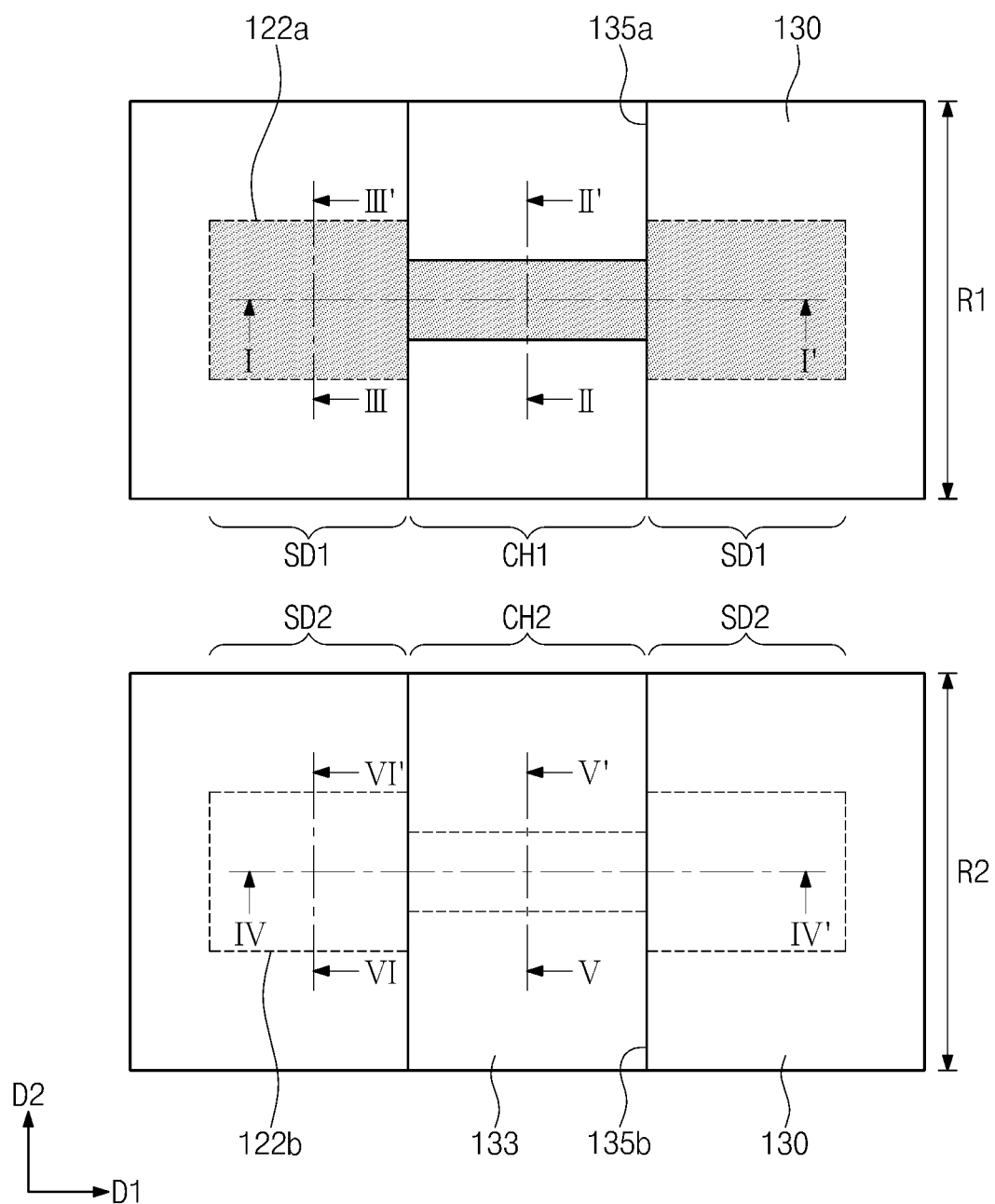
Figure 17B:
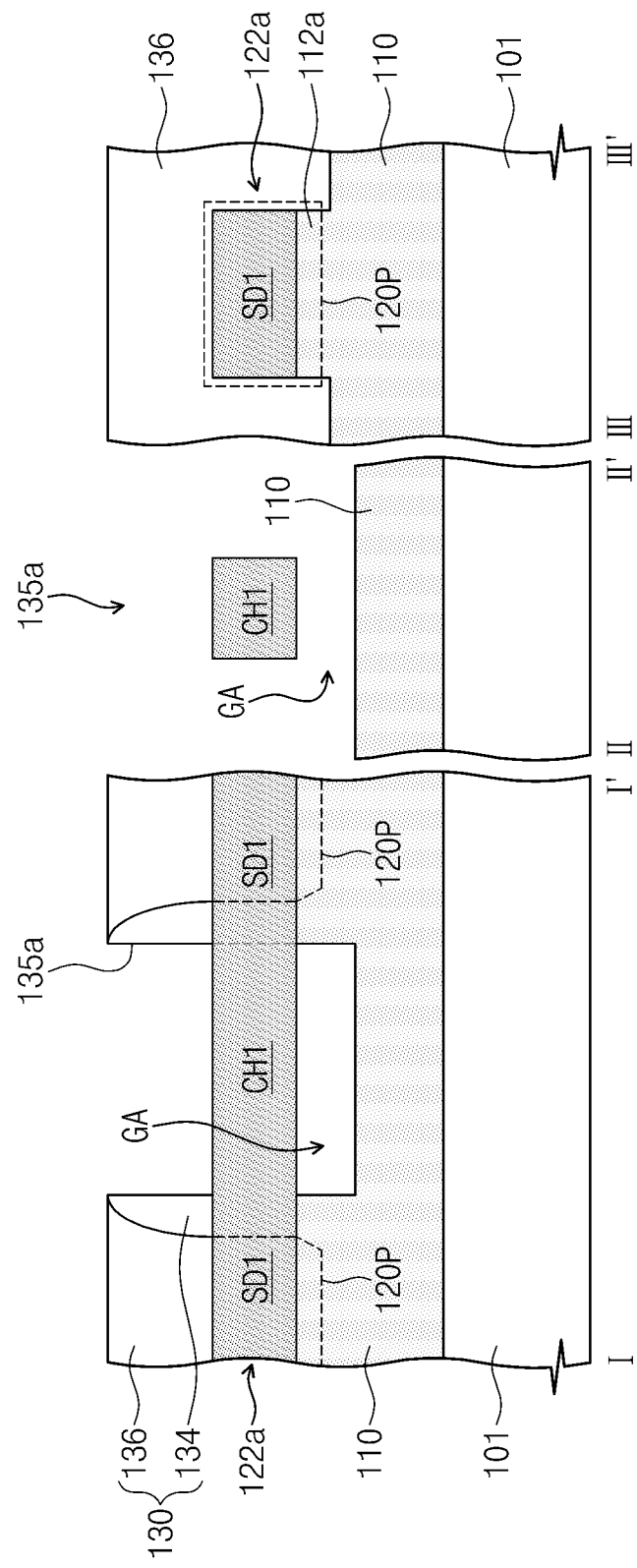
Figure 17C:
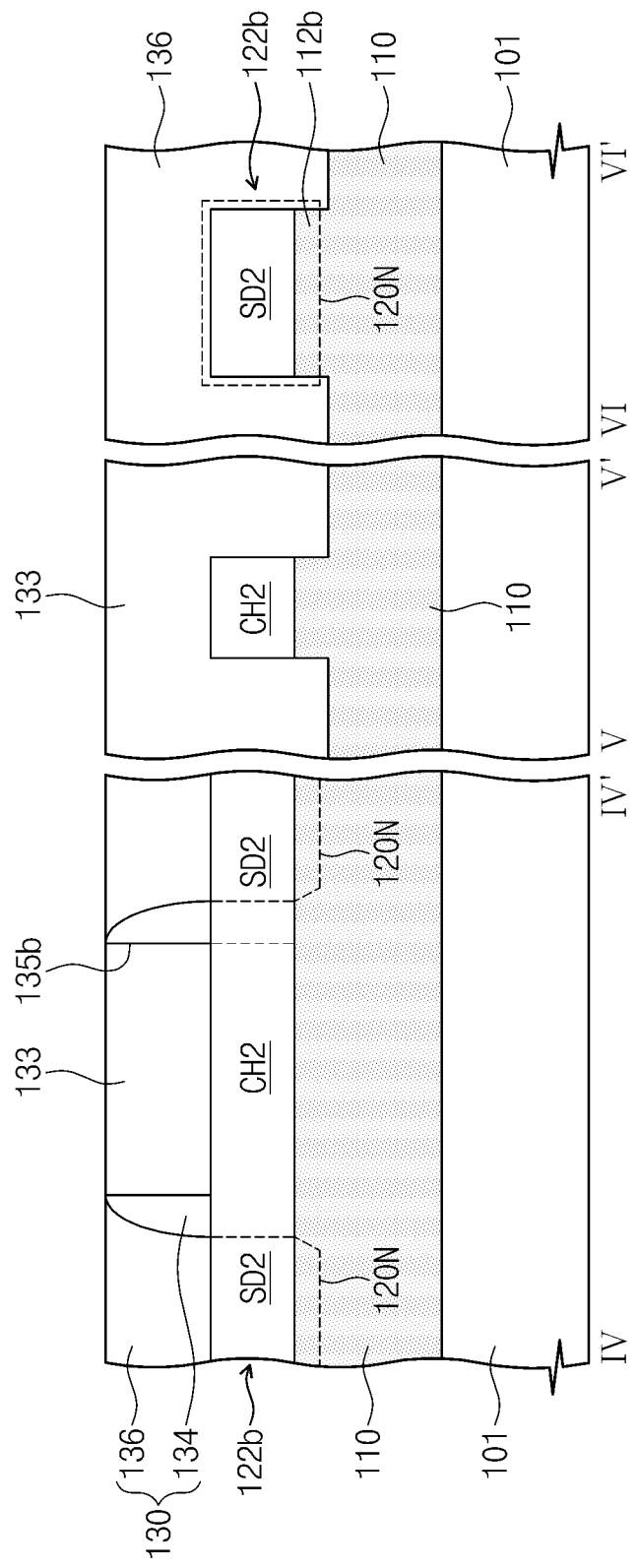

Referring to FIGS. 17A and 17B, the first lower semiconductor pattern 112a and a portion of the SRB layer 110 exposed by the first gate region 135a may be removed. The removal process may be performed using a selective etching process capable of selectively etching the SRB layer 110 and preventing the first upper semiconductor pattern 122a from being etched. As an example, the selective etching process may be performed using an etching solution containing nitric acid or hydrogen peroxide. In certain embodiments, the etching solution may further contain hydrofluoric acid (HF). The first lower semiconductor pattern 112a and the SRB layer 110 may contain a higher amount of silicon than the second upper semiconductor pattern 122b. In this case, the first lower semiconductor pattern 112a and the SRB layer 110 may be selectively etched by the etching solution. Accordingly, the first lower semiconductor pattern 112a and the portion of the SRB layer 110 exposed by the first gate region 135a may be removed to form the gap region GA under the first channel region CH1 of the first upper semiconductor pattern 122a.

Figure 18A:
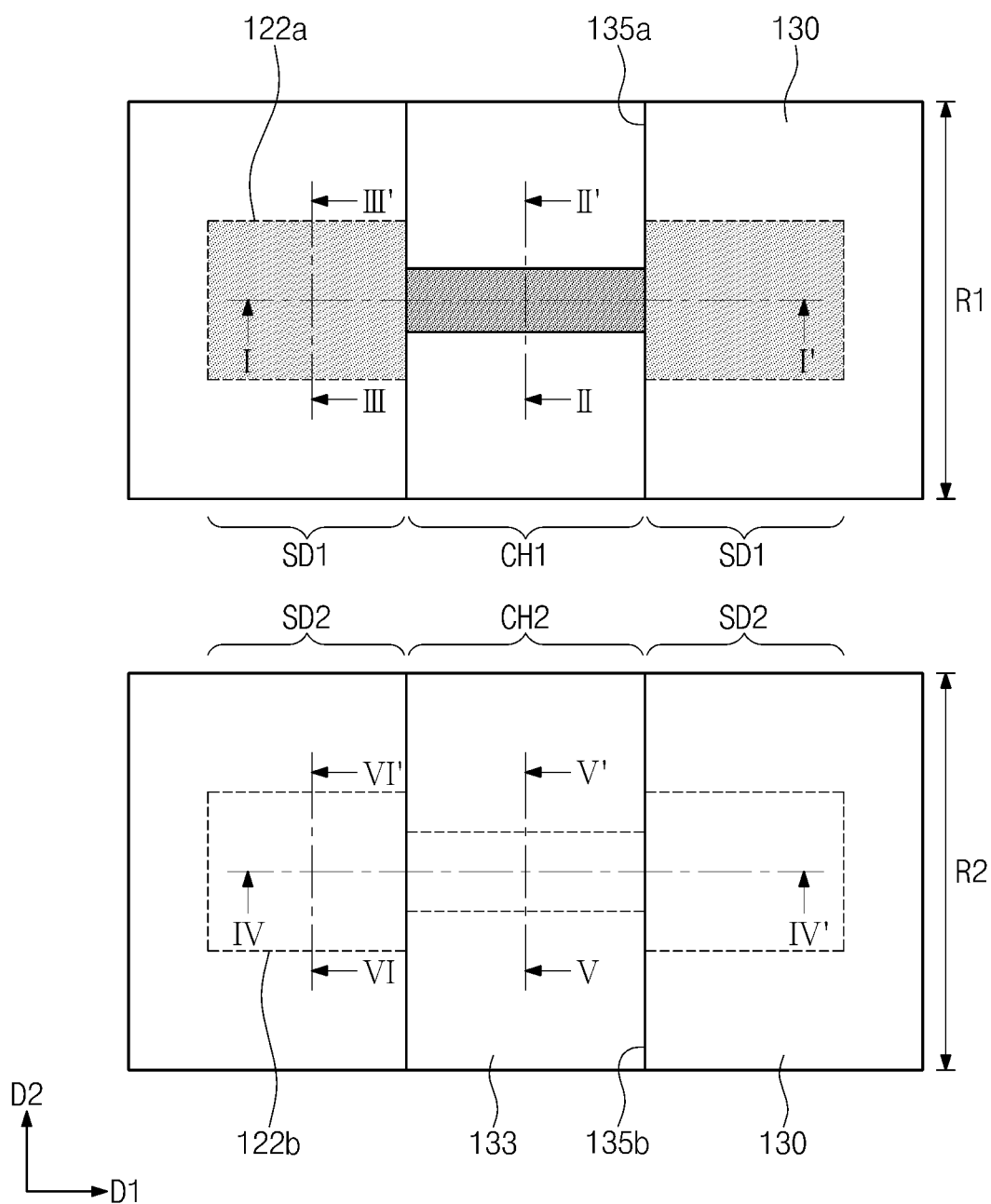
Figure 18B:
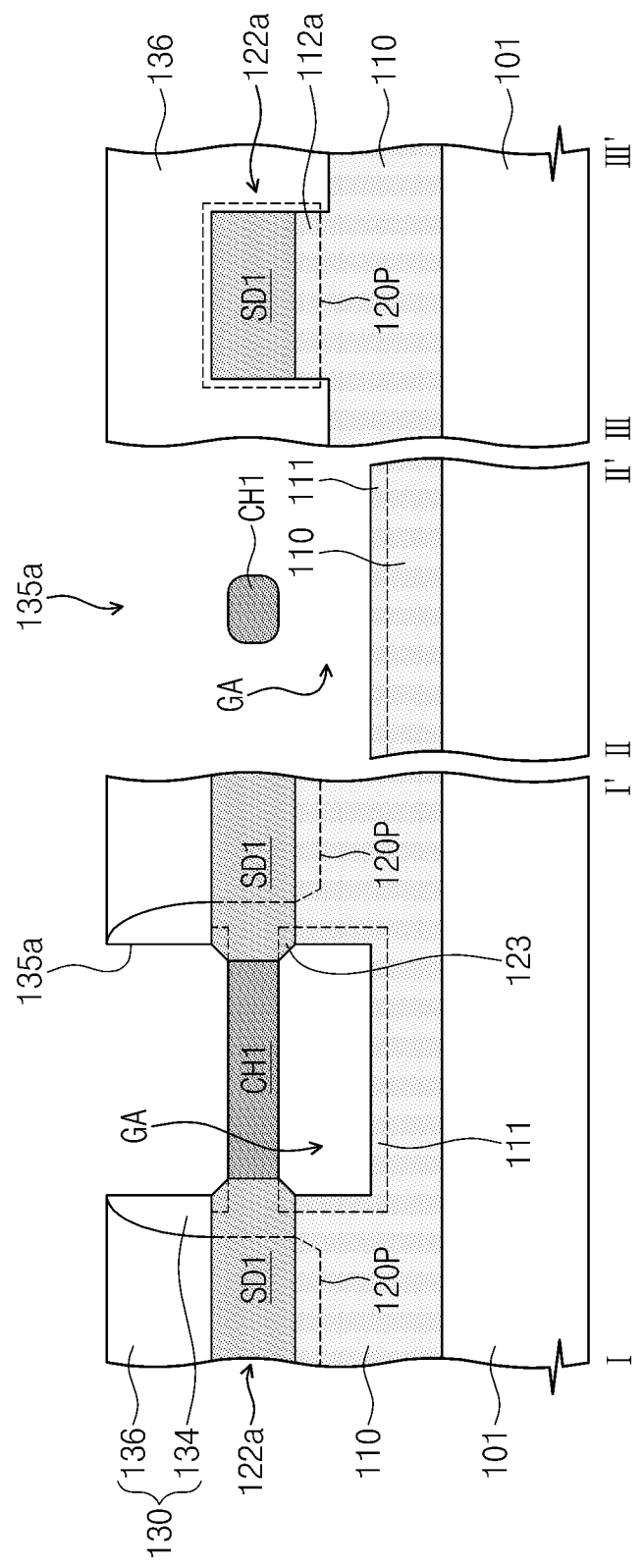
Figure 18C:
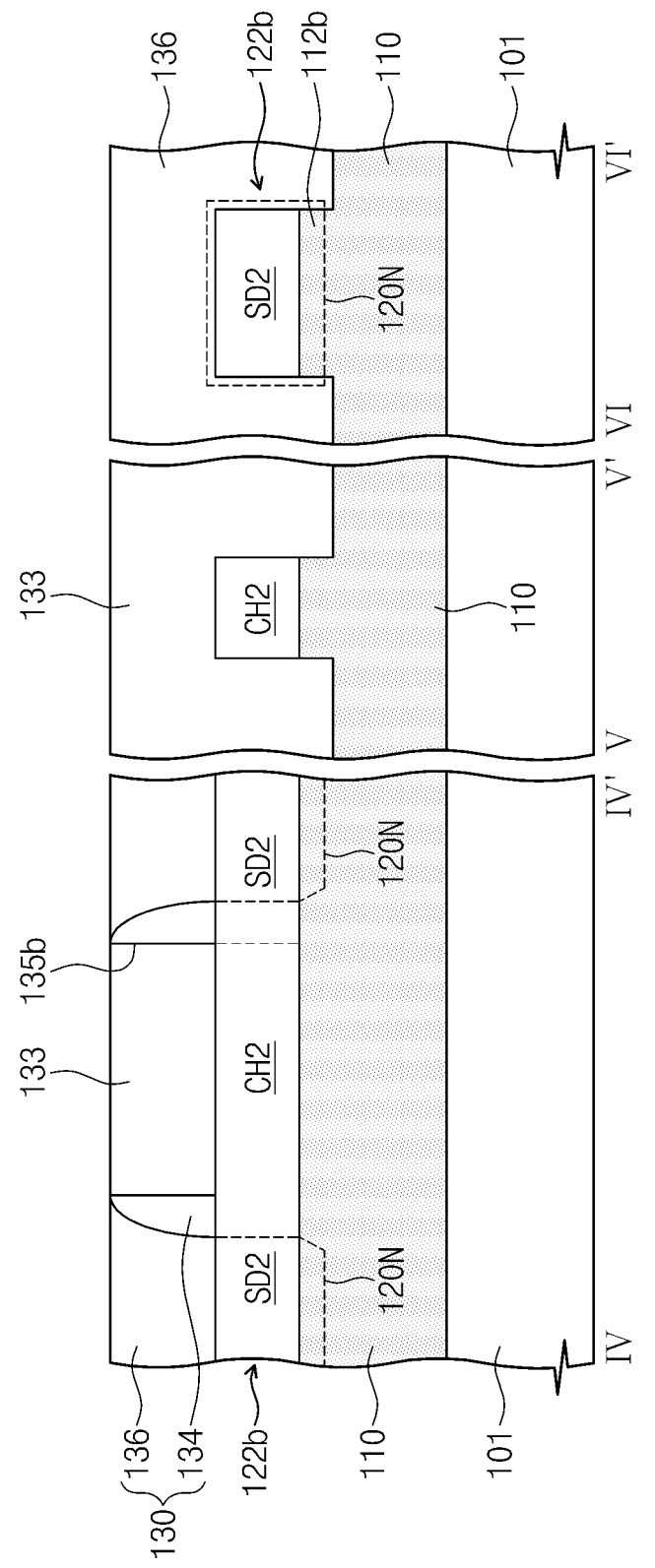

Referring to FIGS. 18A and 18B, after the formation of the gap region GA, a surface treatment process may be performed on the first channel region CH1. The surface treatment process may be a Ge condensation process. The Ge condensation process may include a thermal treatment process to be performed at a temperature of about 600° C. or less. The Ge condensation process may be performed in an oxidizing atmosphere. For example, The Ge condensation process may be performed in an $N_2O$ ambient. Since silicon is more easily oxidized than germanium, a silicon surface of the channel region CH may be selectively oxidized to form a silicon oxide layer. Accordingly, an increase in concentration of germanium may be higher in the first channel region CH1 than in the first source/drain regions SD1. Thus, the germanium concentration may be higher in the first channel region CH1 than in the first source/drain regions SD1. In one embodiment, the first channel region CH1 may contain germanium at a concentration of 60 at % or more. The silicon oxide layer on the first channel region CH1 may be removed by an etching solution containing hydrofluoric acid (HF). The first channel region CH1 may be rounded by the surface treatment process, and thus, a width of the first channel region CH1 may become smaller than those of the first source/drain regions SD1. Accordingly, the first channel region CH1 may have a shape of a nano-sized wire. Further, an increase in the germanium concentration of the SRB layer 110 caused by the surface treatment process may be greater at an outer portion 111 adjacent to the gap region GA than at an internal portion apart from the gap region GA. In addition, an increase in the germanium concentration of the first source/drain regions SD1 may be greater at portions 123 adjacent to the gap region GA than at other portions apart from the gap region GA, and thus, the portions 123 adjacent to the gap region GA may have a higher germanium concentration than the other portions apart from the gap region GA.

Figure 19A:
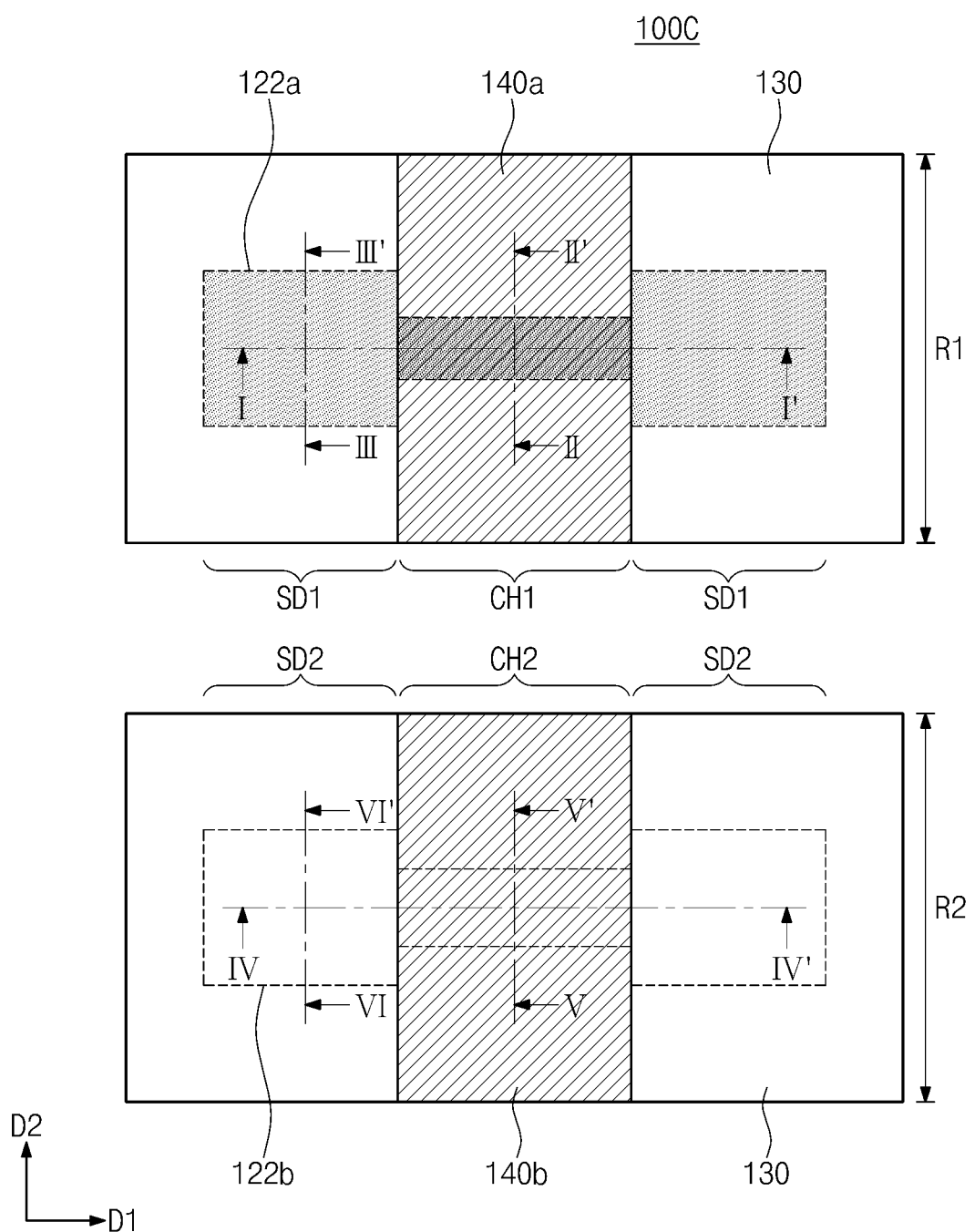
Figure 19B:
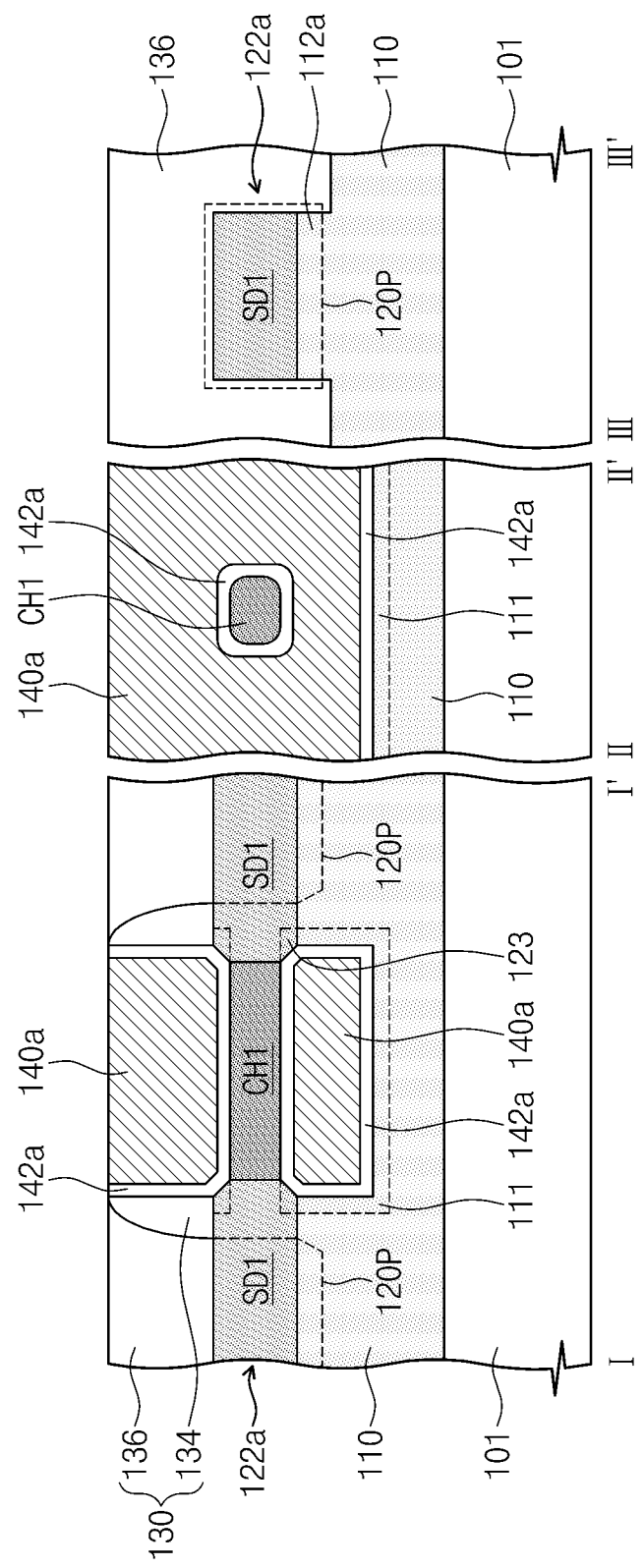
Figure 19C:
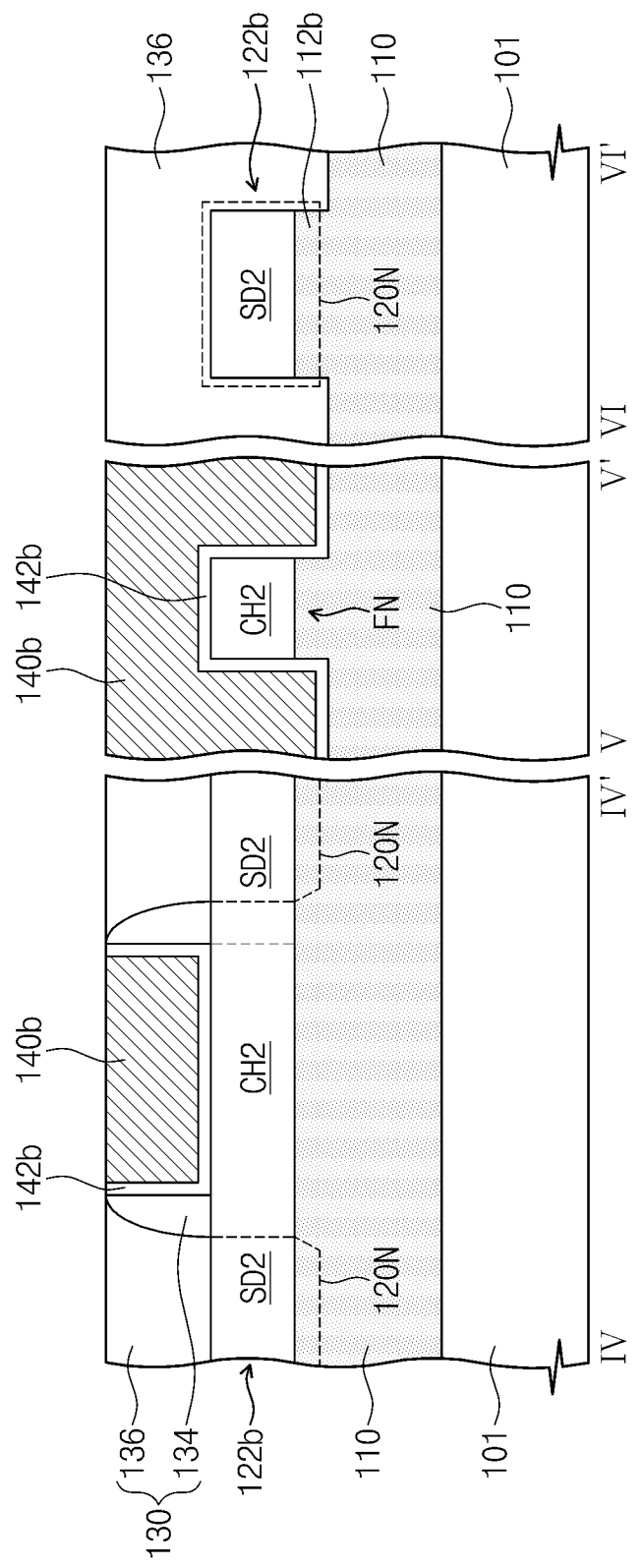

Referring to FIGS. 19A and 19B, the fifth mask pattern 133 may be selectively removed from the second region R2 to expose the second gate region 135b. First and second gate electrodes 140a and 140b may be formed in the first and second gate regions 135a and 135b, respectively. The first and second gate electrodes 140a and 140b may extend parallel to the second direction, which may be substantially perpendicular to an extension direction of the first and second upper semiconductor patterns 122a and 122b, respectively. For example, the first and second gate electrodes 140a and 140b may extend along sidewalls of the first and second upper semiconductor patterns 122a and 122b, respectively. The first gate electrode 140a may extend into the gap region GA to cover a bottom surface of the first upper semiconductor pattern 122a. The first gate electrode 140a may be formed to enclose the first channel region CH1 of the first upper semiconductor pattern 122a. The first and second gate electrodes 140a and 140b may include at least one of a doped silicon layer, conductive metal nitride layers, and metal layers.

Before the formation of the first and second gate electrodes 140a and 140b, first and second gate insulating layers 142a and 142b may be formed between the first and second gate regions 135a and 135b and the first and second gate electrodes 140a and 140b. The first and second gate insulating layers 142a and 142b may be interposed between the first and second gate electrodes 140a and 140b and the insulating spacer 134 and between the first and second gate electrodes 140a and 140b and the SRB layer 110. The first and second gate insulating layers 142a and 142b may include a silicon oxide layer. In certain embodiments, the first and second gate insulating layers 142a and 142b may include a high-k dielectric material, whose dielectric constant is higher than that of the silicon oxide layer. As an example, the first and second gate insulating layers 142a and 142b may include at least one of $HfO_2$, $ZrO_2$ or $Ta_2O_5$.

Hereinafter, a semiconductor device 100B according to still other example embodiments of the inventive concept will be described with reference to FIGS. 19A and 19B. The semiconductor device 100C may include a first transistor TR1 and a second transistor TR2 provided on the first region R1 and the second region R2, respectively. The first transistor TR1 and the second transistor TR2 may be integrated on the substrate 101. The first transistor TR1 and the second transistor TR2 may be a PMOS and an NMOS, respectively.

The SRB layer 110 may be provided between the substrate 101 and first and second transistors TR1 and TR2.

The substrate 101 may be a silicon-containing semiconductor wafer or a silicon-on-insulator (SOI) wafer. The substrate 101 may have a first conductivity type. In one embodiment, the SRB layer 110 may be a silicon germanium layer, whose germanium concentration is 30 at % or less.

The first transistor TR1 may include the first gate electrode 140a and the first channel region CH1, which is spaced apart from the SRB layer 110 with the first gate insulating layer 142a interposed therebetween. The first channel region CH1 may have a rounded profile. In certain embodiments, the first channel region CH1 may have a section that is shaped like a rectangle, ellipse, or circle, but example embodiments of the inventive concepts are not limited thereto. The first gate insulating layer 142a and the first gate electrode 140a may be sequentially provided on the first channel region CH1. The first gate insulating layer 142a and the first gate electrode 140a may extend into the gap region GA between the first upper semiconductor pattern 122a and the SRB layer 110. For example, the first gate insulating layer 142a and the first gate electrode 140a may cover top, bottom, and side surfaces of the first channel region CH1. The first gate insulating layer 142a and the first gate electrode 140a may be provided to enclose a circumference of the first channel region CH1, and the first channel region CH1 may be provided to penetrate the first gate electrode 140a. The first channel region CH1 may be a silicon germanium layer. In one embodiment, the first channel region CH1 may contain germanium at a concentration of 60 at % or more.

The first transistor TR1 may further include the first source/drain regions SD1 that are spaced apart from each other in the first direction with the first channel region CH1 interposed therebetween. The first channel region CH1 may have a width that is smaller than those of the first source/drain regions SD1. The first source/drain regions SD1 may be, for example, a silicon germanium layer. In one embodiment, the first source/drain regions SD1 may contain germanium at a concentration of 30 at % or more. The impurity regions 120P may be formed in the first source/drain regions SD1 to have the first conductivity type. The first impurity regions 120P may extend the first source/drain regions SD1 of the first upper semiconductor pattern 122a into the first lower semiconductor pattern 112a.

The first gate insulating layer 142a may include, for example, a silicon oxide layer. The first gate insulating layer 142a may include, for example, a high-k dielectric material, whose dielectric constant is higher than that of the silicon oxide layer. As an example, the first gate insulating layer 142a may include at least one of $HfO_2$, $ZrO_2$ or $Ta_2O_5$. The first gate electrode 140a may include at least one of doped silicon, conductive metal nitrides, or metals.

The first transistor TR1 may be formed to have a gate-all-around structure. As an example, the first channel region CH1 may be a nano wire or nanotube structure having a width ranging from several nanometers to several ten nanometers. Such a structure of the first channel region CH1 may contribute to prevent a short channel effect from occurring in the first transistor TR1. Since all of the top, bottom, and side surface of the first channel region CH1 are used as a channel region of the first transistor TR1, the first transistor TR1 can have an increased channel width. In general, one way to increase an integration density of a semiconductor device is to reduce a channel width of a transistor. In this case, the transistor may suffer from a narrow channel effect. According to still other example embodiments of the inventive concept, since the first channel region CH1 has the gate-all-around structure, it is possible to relieve short and narrow channel effects of the transistor. According to the conventional art, in the case where the first transistor TR1 has a nano-sized channel, it suffers from low driving current. By contrast, according to still other example embodiments of the inventive concept, since the first channel region CH1 contains germanium of high concentration (e.g., of 60 at % or more), it is possible to increase mobility of an electric current passing therethrough. Accordingly, even when the transistor has a nano-sized channel, the transistor can have a large driving current property.

In the first region R1, the SRB layer 110 may be provided to define the gap region GA adjacent to the first channel region CH1. The germanium concentration of the SRB layer 110 may be higher at a portion 111 adjacent to the gap region GA than at other portions apart from the gap region GA. In addition, the germanium concentration of the source/drain regions SD may be higher at portions 123 adjacent to the gap region GA than at other portions apart from the gap region GA.

The second transistor TR2 may include a fin-shaped portion FN protruding from the substrate 101 in a third direction crossing both of the first and second directions (for example, normal to a top or main surface of the substrate). The fin-shaped portion FN may include the second channel region CH2 and the second source/drain regions SD2, which are disposed spaced apart from each other in the first direction with the second channel region CH2 interposed therebetween. The fin-shaped portion FN may include the second lower semiconductor pattern 112b and the second upper semiconductor pattern 122b that are sequentially stacked on the substrate 101. The second lower semiconductor pattern 112b may be a portion of the SRB layer 110 protruding toward the second upper semiconductor pattern 122b. The second upper semiconductor pattern 122b may be a silicon pattern.

The impurity regions 120N with the second conductivity type may be formed in the second source/drain regions SD2. The second impurity regions 120N may extend from the second source/drain regions SD2 of the second upper semiconductor pattern 122b into the second lower semiconductor pattern 112b.

The second gate insulating layer 142b and the second gate electrode 140b may be sequentially provided on the second channel region CH2. The second gate insulating layer 142b and the second gate electrode 140b may extend along side and top surfaces of the second channel region CH2. The second gate insulating layer 142b may include a silicon oxide layer. In certain embodiments, the second gate insulating layer 142b may include a high-k dielectric material, whose dielectric constant is higher than that of the silicon oxide layer. As an example, the second gate insulating layer 142b may include at least one of $HfO_2$, $ZrO_2$ or $Ta_2O_5$. The second gate electrode 140b may include at least one of doped silicon, conductive metal nitrides, or metals.

The second gate electrode 140b may be formed of or include a material having a different work function from that of the first gate electrode 140a. The first and second gate electrodes 140a and 140b may be formed of or include an aluminum-containing metal layer (e.g., TaAl, TaAl, TaAlC, or TaAlC). An aluminum concentration of the first gate electrode 140a may be smaller than that of the second gate electrode 140b. For example, the first gate electrode 140a may have an aluminum concentration of 50 at % or less, and the second gate electrode 140b may have an aluminum concentration of 50 at % or more. In certain embodiments, the first and second gate electrodes 140a and 140b may further include a tungsten layer provided on the metal layer.

The second channel region CH2 may be connected to the substrate 101 via the SRB layer 110. Accordingly, a channel region of the second transistor TR2 may be electrically connected to a body (for example, the substrate 101). Such a body contact structure of the second transistor TR2 makes it possible to suppress a hot-carrier effect, which may occur when the second transistor TR2 is operated. In general, to increase an integration density of a semiconductor device, it is necessary to reduce a channel length of a transistor. However, the reduction of the channel length may lead to an increase in maximum magnitude of an electric field to be applied to electric carriers near a drain junction, and thus, the electric carriers may have a high enough kinetic energy to cause an impact ionization; that is, hot carriers may be produced. The hot carriers may produce secondary electron-hole pairs, which may result in deterioration in the electrical characteristics of the transistor. In embodiments of the present inventive concepts, since the second channel region CH2 is electrically connected to the substrate 101, charges produced by the hot carriers can be easily discharged to the substrate 101.

Accordingly, the semiconductor device according to still other example embodiments of the inventive concept makes it possible to realize a CMOS device of high performance.

Figure 20:
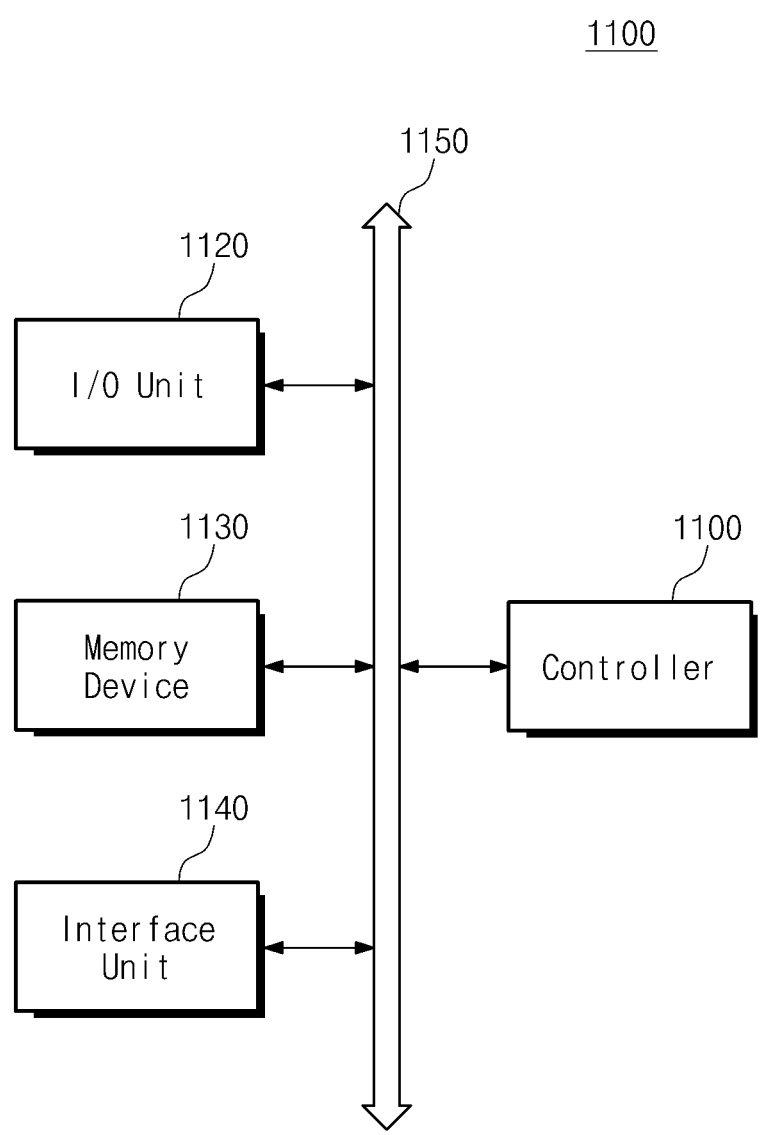
FIG. 20 is a schematic block diagram illustrating an example of electronic systems including a semiconductor device according to example embodiments of the inventive concept.

FIG. 20 is a schematic block diagram illustrating an example of electronic systems including a semiconductor device according to example embodiments of the inventive concept.

As used herein, a semiconductor device may refer to any of the various devices such as shown in the various figures and described above, and may also refer, for example, to a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 20, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided, for example, in the memory device 1130 or as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wired or wireless communication.

Figure 21:
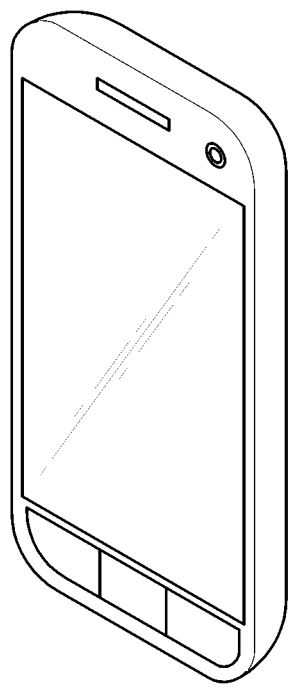
FIG. 21 is a schematic view illustrating an example of various electronic devices, to which the electronic system 1100 of FIG. 20 can be applied.

FIG. 21 is a schematic view illustrating an example of various electronic devices, to which the electronic system 1100 of FIG. 20 can be applied. As shown in FIG. 21, the electronic system 1100 of FIG. 20 can be applied to realize a mobile phone 800. However, it will be understood that, in other embodiments, the electronic system 1100 of FIG. 20 may be applied to portable notebook computers, MP3 players, navigators, solid state disks (SSDs), automobiles, and/or household appliances.

According to example embodiments of the inventive concept, it is possible to easily realize a semiconductor device with a nano wire containing germanium at a high concentration.

For example, example embodiments of the inventive concept provide a semiconductor device including a gate-all-around (GAA) field effect transistor and a method of fabricating the same. The GAA field effect transistor may include a channel region that is provided in the form of a nano wire, whose width ranges from several nanometers to several tens of nanometers. Such a structure of the channel region may contribute to prevent a short or narrow channel effect from occurring in the transistor. Further, according to example embodiments of the inventive concept, since the channel region contains germanium at a high concentration, it is possible to increase mobility of electric charges passing through the channel region. Accordingly, even when the transistor has the nano-sized channel region, the transistor can have a property of large driving current.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first region and a second region;
   a strain relaxed buffer layer provided on the substrate, the strain relaxed buffer layer comprising silicon germanium;
   a first transistor provided on the strain relaxed buffer layer of the first region, the first transistor including a first channel region protruding from the substrate and a first gate electrode covering a side surface of the first channel region; and
   a second transistor provided on the strain relaxed buffer layer of the second region, the second transistor including a second channel region and a second gate electrode enclosing the second channel region and extending between the substrate and the second channel region,
   wherein the first and second channel regions comprise silicon, and a germanium concentration of the second channel region is higher than that of the first channel region.

2. The semiconductor device of claim 1, wherein the first channel includes a silicon layer and the second channel includes a silicon germanium layer.

3. The semiconductor device of claim 2, wherein the second transistor further includes source/drain region at both sides of the second channel, and
   the source/drain region includes a silicon germanium layer and the source/drain region has a germanium concentration that is higher than that of the strain relaxed buffer layer.

4. The semiconductor device of claim 2, wherein the source/drain region comprises germanium at a concentration of 30 at % or more.

5. The semiconductor device of claim 1, wherein the first and second gate electrodes comprise an aluminum-containing metal layer.

6. The semiconductor device of claim 5, wherein an aluminum concentration of the first gate electrode is higher than that of the second gate electrode.

7. The semiconductor device of claim 5, wherein the first and second gate electrodes further comprise a tungsten layer provided on the metal layer.

8. The semiconductor device of claim 5, wherein the first transistor comprises an NMOS transistor and the second transistor comprises a PMOS transistor.

* * * * *